United States Patent
Rosenman et al.

(10) Patent No.: US 9,991,458 B2
(45) Date of Patent: Jun. 5, 2018

(54) NANOSHELL, METHOD OF FABRICATING SAME AND USES THEREOF

(71) Applicants: Ramot at Tel-Aviv University Ltd., Tel-Aviv (IL); Tower Semiconductor Ltd., Migdal HaEmek (IL)

(72) Inventors: Gil Rosenman, Rishon-LeZion (IL); Simon Litsyn, Tel-Aviv (IL); Yakov Roizin, Afula (IL)

(73) Assignees: Ramot at Tel-Aviv University Ltd., Tel-Aviv (IL); Tower Semiconductor Ltd., Migdal HaEmek (IL)

( * ) Notice: Subject to any disclaimer, the term of this patent is extended or adjusted under 35 U.S.C. 154(b) by 223 days.

(21) Appl. No.: 14/402,348

(22) PCT Filed: May 21, 2013

(86) PCT No.: PCT/IL2013/050436
§ 371 (c)(1),
(2) Date: Nov. 20, 2014

(87) PCT Pub. No.: WO2013/175470
PCT Pub. Date: Nov. 28, 2013

(65) Prior Publication Data
US 2015/0108425 A1   Apr. 23, 2015

Related U.S. Application Data

(60) Provisional application No. 61/649,440, filed on May 21, 2012, provisional application No. 61/672,311, (Continued)

(51) Int. Cl.
*H01L 51/42* (2006.01)
*H01L 21/02* (2006.01)
(Continued)

(52) U.S. Cl.
CPC .......... *H01L 51/4213* (2013.01); *B01J 13/04* (2013.01); *B01J 13/203* (2013.01); *B01J 13/22* (2013.01);
(Continued)

(58) Field of Classification Search
CPC ......... B82Y 20/00; B82Y 25/00; B82Y 30/00; B82Y 40/00; H01L 21/02601; H01L 51/4213; H01G 11/36
See application file for complete search history.

(56) References Cited

U.S. PATENT DOCUMENTS

| | | | |
|---|---|---|---|
| 9,134,250 B2 | 9/2015 | Smirnov et al. | |
| 2005/0206300 A1* | 9/2005 | Perlo | B82Y 20/00 313/498 |

(Continued)

FOREIGN PATENT DOCUMENTS

WO    WO 2013/175470    11/2013

OTHER PUBLICATIONS

International Preliminary Report on Patentability Dated Dec. 4, 2014 From the International Bureau of WIPO Re. Application No. PCT/IL2013/050436.
(Continued)

*Primary Examiner* — Thanhha Pham

(57) ABSTRACT

A method of fabricating a nanoshell is disclosed. The method comprises coating a nanometric core made of a first material by a second material, to form a core-shell nanostructure and applying non-chemical treatment to the core-shell nanostructure so as to at least partially remove the nanometric core, thereby fabricating a nanoshell. The disclosed nanoshell can be used in the fabrication of transistors, optical devices (such as CCD and CMOS sensors), memory devices and energy storage devices.

11 Claims, 16 Drawing Sheets

Related U.S. Application Data filed on Jul. 17, 2012, provisional application No. 61/649,443, filed on May 21, 2012.

(51) Int. Cl.

| | |
|---|---|
| *B82Y 20/00* | (2011.01) |
| *B82Y 25/00* | (2011.01) |
| *B82Y 30/00* | (2011.01) |
| *B82Y 40/00* | (2011.01) |
| *H01G 11/36* | (2013.01) |
| *B32B 3/20* | (2006.01) |
| *C23C 16/455* | (2006.01) |
| *H01L 27/146* | (2006.01) |
| *G11C 16/04* | (2006.01) |
| *H01L 21/28* | (2006.01) |
| *H01L 27/10* | (2006.01) |
| *H01L 29/788* | (2006.01) |
| *H01L 27/11521* | (2017.01) |
| *H01L 49/02* | (2006.01) |
| *H01L 29/06* | (2006.01) |
| *G11C 11/56* | (2006.01) |
| *H01G 11/24* | (2013.01) |
| *H01G 11/30* | (2013.01) |
| *C23C 16/44* | (2006.01) |
| *H01M 4/02* | (2006.01) |
| *B01J 13/04* | (2006.01) |
| *B01J 13/20* | (2006.01) |
| *B01J 13/22* | (2006.01) |
| *B32B 15/02* | (2006.01) |
| *H01L 27/11568* | (2017.01) |
| *H01L 27/22* | (2006.01) |
| *H01L 27/28* | (2006.01) |
| *H01L 27/30* | (2006.01) |
| *H01L 27/32* | (2006.01) |
| *H01L 43/02* | (2006.01) |
| *H01L 43/10* | (2006.01) |
| *H01L 43/12* | (2006.01) |
| *H01L 51/00* | (2006.01) |
| *H01L 51/05* | (2006.01) |
| *H01L 51/56* | (2006.01) |
| *B82Y 10/00* | (2011.01) |
| *H01L 29/82* | (2006.01) |
| *H01L 33/00* | (2010.01) |
| *G11C 13/00* | (2006.01) |
| *H01M 4/36* | (2006.01) |

(52) U.S. Cl.
CPC ............... *B32B 3/20* (2013.01); *B32B 15/02* (2013.01); *B82Y 25/00* (2013.01); *B82Y 30/00* (2013.01); *C23C 16/4417* (2013.01); *C23C 16/455* (2013.01); *C23C 16/45525* (2013.01); *G11C 11/5671* (2013.01); *G11C 16/04* (2013.01); *G11C 16/0408* (2013.01); *H01G 11/24* (2013.01); *H01G 11/30* (2013.01); *H01G 11/36* (2013.01); *H01L 21/28273* (2013.01); *H01L 27/10* (2013.01); *H01L 27/11521* (2013.01); *H01L 27/11568* (2013.01); *H01L 27/146* (2013.01); *H01L 27/14625* (2013.01); *H01L 27/222* (2013.01); *H01L 27/283* (2013.01); *H01L 27/301* (2013.01); *H01L 27/307* (2013.01); *H01L 27/3204* (2013.01); *H01L 28/60* (2013.01); *H01L 29/0665* (2013.01); *H01L 29/7881* (2013.01); *H01L 43/02* (2013.01); *H01L 43/10* (2013.01); *H01L 43/12* (2013.01); *H01L 51/0002* (2013.01); *H01L 51/0512* (2013.01); *H01L 51/56* (2013.01); *H01M 4/02* (2013.01); *B82Y 10/00* (2013.01); *B82Y 20/00* (2013.01); *B82Y 40/00* (2013.01); *G11C 13/0014* (2013.01); *G11C 13/0019* (2013.01); *G11C 16/0483* (2013.01); *G11C 2213/18* (2013.01); *G11C 2213/75* (2013.01); *G11C 2213/81* (2013.01); *H01L 29/0673* (2013.01); *H01L 29/788* (2013.01); *H01L 29/82* (2013.01); *H01L 33/00* (2013.01); *H01L 51/0093* (2013.01); *H01M 4/366* (2013.01); *Y02E 60/13* (2013.01)

(56) References Cited

U.S. PATENT DOCUMENTS

2009/0101964 A1   4/2009 Choi et al.
2009/0203196 A1   8/2009 Kim et al.

OTHER PUBLICATIONS

International Search Report and the Written Opinion Dated Sep. 1, 2013 From the International Searching Authority Re. Application No. PCT/IL2013/050436.
Chen et al. "Two- and Three-Dimensional Ordered Structures of Hollow Silver Spheres Prepared by Colloidal Crystal Templating", Advanced Materials, 16(5): 417-422, Mar. 5, 2004. Figs.1, 4.
Graf et al. "Metallodielectric Colloidal Core-Shell Particles for Photonic Applications", Langmuir, 18: 524-534, Dec. 18, 2001. Abstract, p. 527—(b) Hoolow Gold Shells), (c) Silica-Covered Gold Shells), p. 534.
Kim et al. "Fabrication of Hollow Palladium Spheres and Their Successful Application to the Recyclable Heterogeneous Catalyst for Suzuki Coupling Reactions", Journal of the American Chemical Society, JACS, 124(26): 7642-7643, Jun. 8, 2002. Scheme 1, Fig.1.
Meegan et al. "Designed Self-Assembled Beta-Sheet Peptide Fibrils as Templates for Silica Nanotubes", Advanced Functional Materials, 14(1): 31-37, Jan. 29, 2004. p. 35-36 (3. Conclusion & 4. Experimenta).
Ras et al. "Hollow Inorganic Nanospheres and Nanotubes With Tunable Wall Thicknesses by Atomic Layer Deposition on Self-Assembled Polymeric Templates", Advanced Materials, 19(1): 102-106, 2007. Figs.1-2, p. 105—Experimantal.
Wang "Tunable Plasmonic Nanostructures: From Fundamental Nanoscale Optics to Surface-Enhanced Spectroscopies", A Thesis Submitted in Partial Fulfillment of the Requirements for the Degree Doctor of Philosophy of Rice University, Houston, Texas, USA, 257 P., Jul. 2007.

* cited by examiner

NANOSHELL, METHOD OF FABRICATING SAME AND USES THEREOF

RELATED APPLICATIONS

This application is a National Phase of PCT Patent Application No. PCT/IL2013/050436 having International filing date of May 21, 2013, which claims the benefit of priority under 35 USC § 119(e) of U.S. Provisional Patent Application Nos. 61/649,440 filed on May 21, 2012; 61/649,443 filed on May 21, 2012; and 61/672,311 filed on Jul. 17, 2012.

The contents of the above applications are all incorporated by reference as if fully set forth herein in their entirety.

FIELD AND BACKGROUND OF THE INVENTION

The present invention, in some embodiments thereof, relates to nanotechnology and, more particularly, but not exclusively, to nanoshells, method of fabricating the same and applications utilizing thereof.

Nanoscience is the science of small particles of materials and is one of the most important research frontiers in modern technology. These small particles are of interest from a fundamental point of view since they enable construction of materials and structures of well-defined properties. With the ability to precisely control material properties comes new opportunities for technological and commercial development, and applications of nanoparticles have been shown or proposed in areas as diverse as micro- and nanoelectronics, nanophotonics, nanofluidics, coatings and paints and biotechnology.

New fundamental physical phenomena are observed at the nanoscale when the dimensions of the fabricated functional technological units are close to a critical quantum size, called the exciton Bohr radius. The low-dimensional structures are characterized by squeezing electrons and holes inside the highly limited space of nanosize units resulting in their quantum confinement (QC). QC leads to collapse of the continuous density of states of the bulk solid into the discrete electronic states. The effects related to QC have been firstly found in semiconductor crystals of a few nanometer size and showed deep and flexible tuning of their electronic structure versus the nanoparticles physical dimensions providing exceptional luminescent and optical absorption properties. Such a pronounced modification of the electron energy spectrum at nanoscale erases the difference between semiconductor and metals. The low-dimensional crystalline units became the basis for a new generation of light emitting and light detecting devices such as displays, optical detectors, semiconductor lasers, luminescent bio-markers, and the like.

SUMMARY OF THE INVENTION

According to an aspect of some embodiments of the present invention there is provided a method of fabricating a nanoshell. The method comprises coating a nanometric core made of a first material by a second material, to form a core-shell nanostructure and applying non-chemical treatment to the core-shell nanostructure so as to at least partially remove the nanometric core, thereby fabricating a nanoshell.

According to some embodiments of the invention the first material is organic and the second material is inorganic.

According to some embodiments of the invention the first material is synthesized biological material.

According to some embodiments of the invention the second material comprises metal. According to some embodiments of the invention the second material comprises a ferromagnetic material. According to some embodiments of the invention the second material comprises a semiconductor.

According to some embodiments of the invention the coating is by atomic layer deposition.

According to some embodiments of the invention the nanometric core has a shape selected from the group consisting of a generally spherical shape, a tubular shape and a planar shape. According to some embodiments of the invention the nanometric core has an irregular shape.

According to some embodiments of the invention the method comprises depositing at least one additional layer on the nanometric core or the core-shell nanostructure.

According to an aspect of some embodiments of the present invention there is provided a nanoshell structure, comprising a single layer metallic shell being hollow and devoid of any solid substance in the shell.

According to some embodiments of the invention the shell has a shape selected from the group consisting of a generally spherical shape, a tubular shape and a planar shape.

According to an aspect of some embodiments of the present invention there is provided a nanostructure, comprising a hollow shell, characterized by sphericity of at least 0.9 or aspect ratio of at least 0.9.

According to some embodiments of the invention the nanoshell structure is a multilayer shell.

According to some embodiments of the invention an internal surface of the shell comprises, or is at least partially coated by, carbon.

According to an aspect of some embodiments of the present invention there is provided a transistor device, comprising the nanoshell structure as delineated hereinabove and optionally as further exemplified hereinunder. According to some embodiments of the invention transistor device is a floating gate transistor device.

According to an aspect of some embodiments of the present invention there is provided an optical device, comprising a plurality of nanoshell structures each being the nanoshell structure as delineated hereinabove and optionally nanoshell structure as further exemplified hereinunder.

According to some embodiments of the invention the optical device is an image sensor.

According to some embodiments of the invention the nanoshell structures are formed at a back side of the image sensor. According to some embodiments of the invention the nanoshell structures are formed at the front side of the image sensor.

According to some embodiments of the invention the image sensor is selected from the group consisting of a CMOS image sensor and a CCD image sensor.

According to some embodiments of the invention the nanoshell structures are arranged to form pixels, each defining at least two sub-pixels being sensitive to a different wavelength.

According to some embodiments of the invention the optical device is a solar cell. According to some embodiments of the invention the optical device is a photovoltaic cell.

According to some embodiments of the invention the optical device is a light emitting device.

According to some embodiments of the invention the optical device is a display, preferably a flat display, more preferably a flexible flat display.

According to an aspect of some embodiments of the present invention there is provided a magnetic memory device. The device comprises a plurality of nanoshell structures each being the nanoshell structure as delineated hereinabove and optionally the nanoshell structure as further exemplified hereinunder.

According to an aspect of some embodiments of the present invention there is provided an energy storage device. The device comprises a plurality of nanoshell structures each being the nanoshell structure as delineated hereinabove and optionally the nanoshell structure as further exemplified hereinunder.

According to an aspect of some embodiments of the present invention there is provided a memory device. The device comprises a memory layer between a first layer and a second layer, wherein the first layer and the second layer are configured to apply an electrical bias to the memory layer, and wherein the memory layer comprises a plurality of nanoshell structures each being the nanoshell structure as delineated hereinabove and optionally the nanoshell structure as further exemplified hereinunder.

According to some embodiments of the invention the nanoshell structures are separated from each other and wherein regions between at least a few of the nanoshell structures are devoid of material forming an outer surface of the nanoshell structures.

According to some embodiments of the invention the nanoshell structures comprise at least two layers configured to trap charge at an interface between adjacent layers.

According to some embodiments of the invention the nanoshell structures are made, at least in part, from a metal oxide.

According to some embodiments of the invention the device comprises a dielectric layer between the first layer and the second layer.

According to some embodiments of the invention the devices is a NAND memory array.

According to some embodiments of the invention the second layer comprises a plurality of floating gates forming isolated transistors of NAND strings.

According to some embodiments of the invention each isolated transistor is configured to store two bits of information.

According to some embodiments of the invention the nanoshell structures are formed with openings therein, and wherein each floating gate comprises two parts, each originating from a neighboring nanoshell structure.

According to some embodiments of the invention the nanometric core is one of a multiplicity of nanometric cores made of the first material, wherein the coating comprises coating the multiplicity of nanometric cores by second material to form a respective multiplicity of core-shell nanostructures, and the non-chemical treatment is selected to at least partially remove the multiplicity of nanometric cores, thereby fabricating a multiplicity of nanoshell structures.

According to some embodiments of the invention the multiplicity of nanoshell structures are arranged over a pixel area of an image sensor. According to some embodiments of the invention the pixel area comprises a plurality of sub-pixel areas. According to some embodiments of the invention each sub-pixel area comprises a plurality of nanoshell structures. According to some embodiments of the invention, for each sub-pixel area, shell thicknesses of nanoshell structures in the sub-pixel area differ from shell thicknesses of nanoshell structures in all other sub-pixel areas.

According to some embodiments of the invention the fabrication of the multiplicity of nanoshell structures to form the pixel area comprises: depositing the multiplicity of nanometric cores made of the first material on a substrate, coating the multiplicity of nanometric cores by the second material, applying the non-chemical treatment to at least partially remove the nanometric core, thereby to form the multiplicity of nanometric shell structures, applying a mask on nanometric shell structures occupying a first sub-pixel area, coating the mask and nanometric shell structures occupying other sub-pixel areas by the second material, and removing the mask.

According to some embodiments of the invention the method comprises depositing a multiplicity of nanometric structures made of a first material over a pixel array, wherein each pixel is defined over a plurality of sub-pixel areas, and wherein each sub-pixel area is occupied by a plurality of nanometric structures. According to some embodiments of the invention the method comprises coating the multiplicity of nanometric cores by a second material, and applying a mask on nanometric shell structures occupying at least a first sub-pixel area, leaving nanometric shell structures occupying at least a second sub-pixel area unmasked. According to some embodiments of the invention the method comprises coating the mask and the unmasked nanometric shell structures, and removing the mask.

According to an aspect of some embodiments of the present invention there is provided a method of fabricating a memory layer. The method comprises: depositing an arrangement of organic nanostructures on a substrate; coating the organic nanostructures by a layer selected to allow charge storage therein, thereby forming a plurality of core-shell nanostructures; and applying non-chemical treatment to the core-shell nanostructures so as to remove the organic nanostructures, thereby forming nanoshell structures.

According to some embodiments of the invention the coating is selective.

According to some embodiments of the invention the coating is by atomic layer deposition.

According to some embodiments of the invention the method comprises applying heat treatment to the organic nanostructures, prior to the coating.

According to some embodiments of the invention the method comprises applying Rapid Thermal Processing (RTP) to the nanoshell structures.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
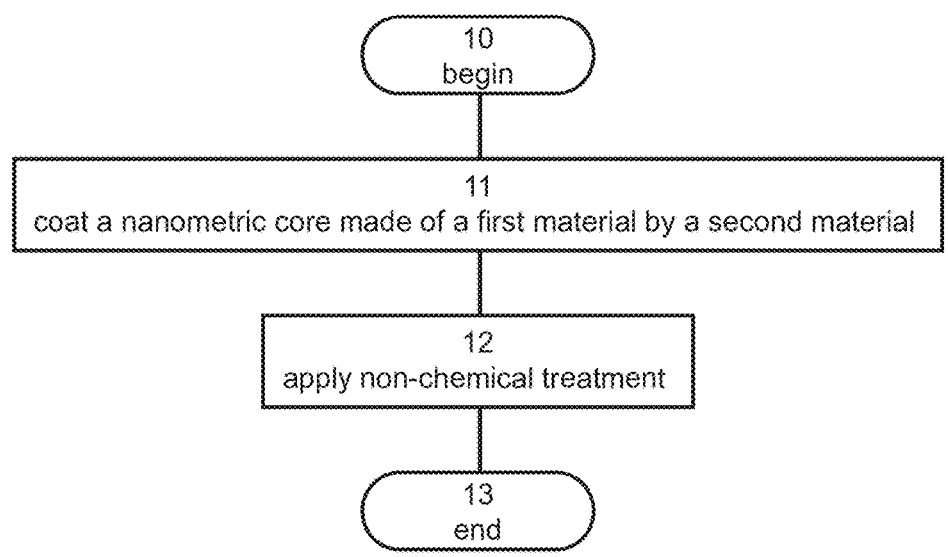
FIG. 1 is a flowchart diagram illustrating a method suitable for fabricating a nanoshell structure, according to some embodiments of the present invention.

The present invention, in some embodiments thereof, relates to nanotechnology and, more particularly, but not exclusively, to nanoshells, method of fabricating the same and applications utilizing thereof.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 is a schematic illustration of a method suitable for fabricating a nanoshell structure, according to some embodiments of the present invention.

As used herein "nanoshell structure" refers to a hollow structure having a largest dimension less than 1 µm, preferably less than 500 nm, more preferably less than 100 nm, more preferably less than 50 nm, more preferably less than 10 nm, or less than 5 nm, e.g., from about 2 nm to about 5 nm or from about 2 nm to about 4 nm or from about 2 nm to about 3 nm.

In various exemplary embodiments of the invention the method fabricates a plurality of nanoshell structures simultaneously. In some embodiments of the present invention, the largest dimension of X % of the nanoshell structures is less than 500 nm, more preferably less than 100 nm, more preferably less than 50 nm, more preferably less than 10 nm, or less than 5 nm, e.g., from about 2 nm to about 5 nm, or from about 2 nm to about 4 nm, or from about 2 nm to about 3 nm, where X is at least 70 or at least 80 or at least 90 or at least 95 or at least 99.

The method begins at 10 and continues to 11 at which a nanometric core made of a first material is at least partially coated by a second material, to form a core-shell nanostructure. The first material serves as a sacrificial nanometric scaffold for fabricating a shell made of the second material.

The largest dimension of the sacrificial nanometric scaffold is than 1 µm, preferably less than 500 nm, more preferably less than 100 nm, more preferably less than 50 nm, more preferably less than 10 nm, or less than 5 nm, e.g., from about 2 nm to about 5 nm or from about 2 nm to about 4 nm or from about 2 nm to about 3 nm.

The sacrificial nanometric scaffolds can be deposited onto a substrate, e.g., a semiconductor substrate, and the coating can be performed while the scaffolds are on the substrate. A representative example of a coating process suitable for the present embodiments is, without limitation Atomic Layer Deposition (ALD) onto the surfaces of the scaffolds.

ALD is an advanced thin film deposition process that allows forming highly conformal nanometer thin films of various materials at the arbitrarily shaped substrates. The process includes sequential deposition of reactive species at the surface with a further thermal pulse resulting in a chemical reaction. Thus, an atomic layer of the targeted substance is produced.

Some embodiments of the present invention employ selective growth of ALD films on peptide or other organic self-organized materials without specifying the physical cause of such selective growth, or whether the growth is at the external or internal surface of hollow peptide building blocks. It is noted that while selective ALD is not excluded from the scope of the present invention, it is not necessary for the ALD to be selective. In some embodiments of the present invention the thickness of the deposited metal shells is less than 200 nm or less than 100 nm or less than 50 nm or less than 40 nm or less than 30 nm or less than 20 nm or less than 10 nm, e.g., about 5 nm. In various exemplary embodiments of the invention the thickness of the deposited metal shell is at least 5 nm. Thin metal shell is particularly useful in optical application.

Deposition of several metal compositions by ALD at low temperatures has been reported in S. T Kochuveedu, et al. Surface-Plasmon-Induced Visible Light Photocatalytic Activity of TiO2 Nanospheres Decorated by Au Nanoparticles, Journal of Physical Chemistry C, v. 116 2500-2506, 2012; and Jeffrey W. Elam et al., ALD deposition of ITO thin films using nonhalogenated precursors, J. Phys. Chem. C 2008, 112, 1938-1945; and J. W. Elama Surface chemistry and film growth during TiN atomic layer deposition using TDMAT and NH3, Thin Solid Films xx Thin Solid Films 436 (2003) 145-156. ITO (indium tin oxide) and TiN films were deposited at temperatures below 150° C. ALD processes are applicable particularly, but not exclusively, to ruthenium, platinum, iridium, rhodium, and palladium were also studied. The process is optionally and preferably based on the reaction of the metal precursor with oxygen. A typical process temperatures is, without limitation, about 200-250° C. Metallic silver films can be deposited, for example, by radical-enhanced atomic layer deposition (REALD) using (2,2-dimethylpropionato)sil-ver(I)triethylphosphine and hydrogen radicals. The hydrogen radicals can be produce by dissociating molecular hydrogen with a microwave plasma discharge. The evaporation temperature of the silver precursor is about 125° C., and the film deposition temperature can be about 140° C. [to this end see, e.g., [A Niskanen et al., Radical-Enhanced Atomic Layer Deposition of Silver Thin Films Using Phosphine-Adducted Silver Carboxylates, Chemical Vapor Deposition (2007) Volume: 13, Issue: 8, Pages: 408-413].

Representative materials which can be used for coating the scaffolds and which are suitable for ALD process, include, without limitation, noble metals (e.g., Pt, Pd, Ag, Au), Ni, Ni, Cu, metal compound (e.g., TiN, ITO), bimetallic or trimetallic alloys (e.g., silver-gold alloy), dielectric materials such as, but not limited to, metal oxide (e.g., $Al_2O_3$, $HfO_2$, $TiO_2$), semi-metal oxide (e.g., $SiO_2$) or semi-metal nitride (e.g., $Si_3N_4$).

Figure 2A:
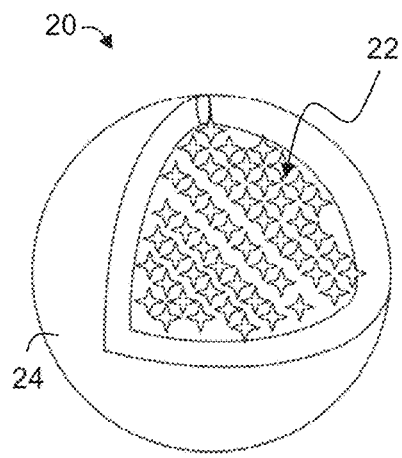
FIGS. 2A and 2B are schematic illustrations of a core-shell structure (FIG. 2A) and a hollow nanoshell structure (FIG. 2B), according to some embodiments of the present invention.

FIG. 2A is a schematic illustration of a core-shell structure 20, wherein the core is shown at 22 and the shell is shown at 24.

Figure 2B:
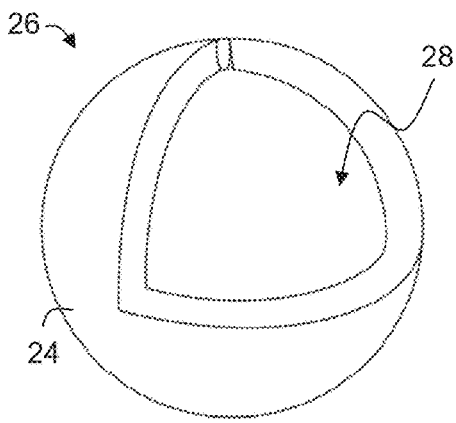

Once the core-shell structure is formed, the method continues to 12 at which a non-chemical treatment is applied to the core-shell nanostructure so as to at least partially remove the nanometric core, thereby to fabricate the nanoshell structure. FIG. 2B is a schematic illustration of a nanoshell structure 26, wherein shell 24 encloses a void 28.

The method ends at 13.

The sacrificial nanometric scaffold used by the method is optionally and preferably made from an organic material.

As used herein, the phrase "organic material" describes any substance that comprises carbon and hydrogen atoms, with or without additional elements.

In some embodiments of the present invention the organic material comprises a biological material, more preferably chemically-synthesized biological material.

The term "biological material" is used herein to refer to any organic material, including a single organic molecule, that is, was, or can be a part of a living organism, regardless of whether the molecule is naturally occurring, recombinantly produced, or chemically synthesized in whole or in part.

Classes of biomolecules suitable for the present embodiments include, without limitation nucleic acids (and artificial analogs thereof), peptides, lipids, polysaccharides, monosaccharides, amino acids, nucleotides (as well as nucleosides, purines and pyrimidines), flavonoids, isoprenoids, oligomeric species, polymeric species and viruses. Also contemplated, are oligonucleotides, genes, hormones, growth factors, enzymes, co-factors, antisenses, antibodies, antigens, vitamins, immunoglobulins, cytokines, prostaglandins, toxins, ferritins and the like. In some embodiments of the present invention the nanometric scaffolds comprise at least one of peptides, nucleic acids, nucleotides and amino acids. Of the above substances, substances whose molecular shape is generally spherical are useful when it is desired to fabricate generally spherical nanoshell structures.

The term "peptide" as used herein encompasses native peptides (either degradation products, synthetically synthesized peptides or recombinant peptides) and peptidomimetics (typically, synthetically synthesized peptides), as well as peptoids and semipeptoids which are peptide analogs, which may have, for example, modifications rendering the peptides more stable while in a body. Such modifications include, but are not limited to N terminus modification, C terminus modification, peptide bond modification, including, but not limited to, $CH_2$—NH, $CH_2$—S, $CH_2$—S=O, O=C—NH, $CH_2$—O, $CH_2$—$CH_2$, S=C—NH, CH=CH or CF=CH, backbone modifications, and residue modification. Methods for preparing peptidomimetic compounds are well known in the art and are specified, for example, in Quantitative Drug Design, C. A. Ramsden Gd., Chapter 17.2, F. Choplin Pergamon Press (1992), which is incorporated by reference as if fully set forth herein. Further details in this respect are provided hereinunder.

Peptide bonds (—CO—NH—) within the peptide may be substituted, for example, by N-methylated bonds (—N($CH_3$)—CO—), ester bonds (—C(R)H—C—O—O—C(R)—N—), ketomethylen bonds (—CO—$CH_2$—), α-aza bonds (—NH—N(R)—CO—), wherein R is any alkyl, e.g., methyl, carba bonds (—$CH_2$—NH—), hydroxyethylene bonds (—CH(OH)—$CH_2$—), thioamide bonds (—CS—NH—), olefinic double bonds (—CH=CH—), retro amide bonds (—NH—CO—), peptide derivatives (—N(R)—$CH_2$—CO—), wherein R is the "normal" side chain, naturally presented on the carbon atom.

These modifications can occur at any of the bonds along the peptide chain and even at several (2-3) at the same time.

As used herein the phrase "amino acid" or "amino acids" is understood to include the 20 naturally occurring amino acids; those amino acids often modified post-translationally in vivo, including, for example, hydroxyproline, phosphoserine and phosphothreonine; and other unusual amino acids including, but not limited to, 2-aminoadipic acid, hydroxylysine, isodesmosine, nor-valine, nor-leucine and ornithine. Furthermore, the term "amino acid" includes both D- and L-amino acids.

Natural aromatic amino acids, Trp, Tyr and Phe, may be substituted for synthetic non-natural acid such as Phenylglycine, TIC, napthylalanine (Nal), phenylisoserine, threoninol, ring-methylated derivatives of Phe, halogenated derivatives of Phe or O-methyl-Tyr and β-amino acids.

The peptides of the present embodiments may include one or more modified amino acids or one or more non-amino acid monomers (e.g. fatty acids, complex carbohydrates etc).

The peptides can include aromatic and/or non-aromatic amino acid residue.

The phrase "aromatic amino acid residue", as used herein, describes an amino acid residue that has an aromatic moiety, as defined herein, in its side-chain.

In some embodiments each of the peptides comprises the amino acid sequence X—Y or Y—X, wherein X is an aromatic amino acid residue and Y is any other amino acid residue. Use of peptides which are devoid of aromatic amino acid residues is also contemplated.

The peptides of the present invention can be a single amino acid or a peptide composed of at least 2 amino acids in length.

In some embodiments of the present invention, one or several of the peptides is a polyaromatic peptide, which comprises one, two or more aromatic amino acid residues.

As used herein the phrase "polyaromatic peptides" refers to peptides which include at least 80%, more preferably at least 85%, more preferably at least 90%, more preferably at least 95% or more aromatic amino acid residues. In some embodiments, at least one peptide consists essentially of aromatic amino acid residues. In some embodiments, each peptide consists essentially of aromatic amino acid residues.

Thus for example, the peptides can include any combination of: dipeptides composed of one or two aromatic amino acid residues; tripeptides including one, two or three aromatic amino acid residues; and tetrapeptides including two, three or four aromatic amino acid residues and so on.

In some embodiments of the present invention, the aromatic amino acid are any naturally occurring or synthetic aromatic residue including, but not limited to, phenylalanine, tyrosine, tryptophan, phenylglycine, or modificants, precursors or functional aromatic portions thereof.

In some embodiments, one or more peptides include two amino acid residues, and hence is a dipeptide.

Each of these dipeptides can include one or two aromatic amino acid residues. Preferably, but not obligatorily each of these dipeptides includes two aromatic amino acid residues. The aromatic residues composing the dipeptide can be the same, such that the dipeptide is a homodipeptide, or different. In some embodiments, the nanostructures are formed from homodipeptides.

Hence, in some embodiments each peptide is a homodipeptide composed of two aromatic amino acid residues that are identical with respect to their side-chains residue.

The aromatic amino acid residues can comprise an aromatic moiety, where the phrase "aromatic moiety" describes a monocyclic or polycyclic moiety having a completely conjugated pi-electron system. The aromatic moiety can be an all-carbon moiety or can include one or more heteroatoms such as, for example, nitrogen, sulfur or oxygen. The aromatic moiety can be substituted or unsubstituted, whereby when substituted, the substituent can be, for example, one or more of alkyl, trihaloalkyl, alkenyl, alkynyl, cycloalkyl, aryl, heteroaryl, heteroalicyclic, halo, nitro, azo, hydroxy, alkoxy, thiohydroxy, thioalkoxy, cyano and amine.

Exemplary aromatic moieties include, for example, phenyl, biphenyl, naphthalenyl, phenanthrenyl, anthracenyl, [1,10]phenanthrolinyl, indoles, thiophenes, thiazoles and, [2,2']bipyridinyl, each being optionally substituted. Thus, representative examples of aromatic moieties that can serve as the side chain within the aromatic amino acid residues described herein include, without limitation, substituted or unsubstituted naphthalenyl, substituted or unsubstituted phenanthrenyl, substituted or unsubstituted anthracenyl, substituted or unsubstituted [1,10]phenanthrolinyl, substituted or unsubstituted [2,2']bipyridinyl, substituted or unsubstituted biphenyl and substituted or unsubstituted phenyl.

The aromatic moiety can alternatively be substituted or unsubstituted heteroaryl such as, for example, indole, thiophene, imidazole, oxazole, thiazole, pyrazole, pyridine, pyrimidine, quinoline, isoquinoline, quinazoline, quinoxaline, and purine. When substituted, the phenyl, naphthalenyl or any other aromatic moiety includes one or more substituents such as, but not limited to, alkyl, trihaloalkyl, alkenyl, alkynyl, cycloalkyl, aryl, heteroaryl, heteroalicyclic, halo, nitro, azo, hydroxy, alkoxy, thiohydroxy, thioalkoxy, cyano, and amine.

Representative examples of homodipeptides that can be used to form the nanostructures of the present embodiments include, without limitation, a naphthylalanine-naphthylalanine dipeptide, phenanthrenylalanine-phenanthrenylalanine dipeptide, anthracenylalanine-anthracenylalanine dipeptide, [1,10]phenanthrolinylalanine-[1,10]phenanthrolinylalanine dipeptide, [2,2']bipyridinylalanine-[2,2']bipyridinylalanine dipeptide, (pentahalo-phenylalanine)-(pentahalo-phenylalanine)dipeptide, phenylalanine-phenylalanine dipeptide, (amino-phenylalanine)-(amino-phenylalanine)dipeptide, (dialkylamino-phenylalanine)-(dialkylamino-phenylalanine)dipeptide, (halophenylalanine)-(halophenylalanine)dipeptide, (alkoxy-phenylalanine)-(alkoxy-phenylalanine)dipeptide, (trihalomethyl-phenylalanine)-(trihalomethyl-phenylalanine)dipeptide, (4-phenyl-phenylalanine)-(4-phenyl-phenylalanine)dipeptide and (nitro-phenylalanine)-(nitro-phenylalanine)dipeptide.

In some embodiments of the present invention one or more of the peptides is modified by end-capping.

The phrase "end-capping modified peptide", as used herein, refers to a peptide which has been modified at the N-(amine)terminus and/or at the C-(carboxyl)terminus thereof. The end-capping modification refers to the attachment of a chemical moiety to the terminus, so as to form a cap. Such a chemical moiety is referred to herein as an end-capping moiety and is typically also referred to herein and in the art, interchangeably, as a peptide protecting moiety or group.

The phrase "end-capping moiety", as used herein, refers to a moiety that when attached to the terminus of the peptide, modifies the end-capping. The end-capping modification typically results in masking the charge of the peptide terminus, and/or altering chemical features thereof, such as, hydrophobicity, hydrophilicity, reactivity, solubility and the like. Examples of moieties suitable for peptide end-capping modification can be found, for example, in Green et al., "Protective Groups in Organic Chemistry", (Wiley, second ed. 1991) and Harrison et al., "Compendium of Synthetic Organic Methods", Vols. 1-8 (John Wiley and Sons, 1971-1996).

The use of end-capping modification, allows to control the chemical properties and charge of the nanostructures. End-capping of a peptide can be used to modify its hydrophobic/hydrophilic nature.

Representative examples of N-terminus end-capping moieties suitable for the present embodiments include, but are not limited to, formyl, acetyl (also denoted herein as "Ac"), trifluoroacetyl, benzyl, benzyloxycarbonyl (also denoted herein as "Cbz"), tert-butoxycarbonyl (also denoted herein as "Boc"), trimethylsilyl (also denoted "TMS"), 2-trimethylsilyl-ethanesulfonyl (also denoted "SES"), trityl and substituted trityl groups, allyloxycarbonyl, 9-fluorenylmethyloxycarbonyl (also denoted herein as "Fmoc"), and nitro-veratryloxycarbonyl ("NVOC").

Representative examples of C-terminus end-capping moieties suitable for the present embodiments are typically moieties that lead to acylation of the carboxy group at the C-terminus and include, but are not limited to, benzyl and trityl ethers as well as alkyl ethers, tetrahydropyranyl ethers, trialkylsilyl ethers, allyl ethers, monomethoxytrityl and dimethoxytrityl. Alternatively the —COOH group of the C-terminus end-capping may be modified to an amide group.

Other end-capping modifications of peptides include replacement of the amine and/or carboxyl with a different moiety, such as hydroxyl, thiol, halide, alkyl, aryl, alkoxy, aryloxy and the like, as these terms are defined herein.

In some embodiments of the present invention, all of the peptides that are used for the fabrication of nanoshell structures are end-capping modified.

End-capping moieties can be further classified by their aromaticity. Thus, end-capping moieties can be aromatic or non-aromatic.

Representative examples of non-aromatic end capping moieties suitable for N-terminus modification include, without limitation, formyl, acetyl trifluoroacetyl, tert-butoxycarbonyl, trimethylsilyl, and 2-trimethylsilyl-ethanesulfonyl. Representative examples of non-aromatic end capping moieties suitable for C-terminus modification include, without limitation, amides, allyloxycarbonyl, trialkylsilyl ethers and allyl ethers.

Representative examples of aromatic end capping moieties suitable for N-terminus modification include, without limitation, fluorenylmethyloxycarbonyl (Fmoc). Representative examples of aromatic end capping moieties suitable for C-terminus modification include, without limitation, benzyl, benzyloxycarbonyl (Cbz), trityl and substituted trityl groups.

When dipeptides are employed, they can be collectively represented by the following general Formula I:

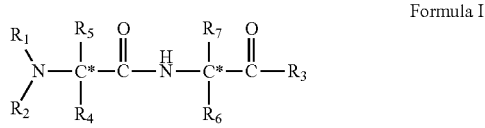

Formula I where:

C* is a chiral or non-chiral carbon; $R_1$ and $R_2$ are each independently selected from the group consisting of hydrogen, alkyl, cycloalkyl, aryl, carboxy, thiocarboxy, C-carboxylate and C-thiocarboxylate; $R_3$ is selected from the group consisting of hydroxy, alkoxy, aryloxy, thiohydroxy, thioalkoxy, thioaryloxy, halo and amine; and each of $R_4$-$R_7$ is independently selected from the group consisting of hydrogen, alkyl, cycloalkyl, aryl, heteroaryl, heteroalicyclic, hydroxy, thiohydroxy (thiol), alkoxy, aryloxy, thioalkoxy, thioaryloxy, C-carboxylate, C-thiocarboxylate, N-carbamate, N-thiocarbamate, hydrazine, guanyl, and guanidine, as these terms are defined herein, provided that at least one of $R_4$-$R_7$ comprises an aromatic moiety, as defined hereinabove.

Also contemplated are embodiments in which one or more of $R_4$-$R_7$ is other substituent, provided that at least one comprises an aromatic moiety.

Also contemplated are embodiments in which one or more of $R_1$-$R_3$ is the end-capping moieties described hereinabove.

Depending on the substituents, each of the C* carbon atoms in each of the compounds described above, can be chiral or non-chiral. Any chiral carbon atom that is present in the peptides of the present embodiments can be in D-configuration, L-configuration or racemic. Thus, the present embodiments encompass any combination of chiral and racemic carbon atoms, including all the possible stereoisomers, optical isomers, enantiomers, and anomers. The peptides of the present embodiments can be synthesized while retaining a configuration of the reactants (e.g., the amino acids). Hence, by selecting the configuration of the reactants (e.g., amino acids) and the appropriate syntheses conditions, the optical purity (e.g., the inclusion of chiral and/or racemic carbons) and the obtained stereoisomers of the resulting peptides can be determined. In cases where racemic mixtures are obtained, known techniques can be used to separate the optical or stereo-isomers. Such techniques are described, for example, in "Organic chemistry, fourth Edition by Paula Yurkanis Bruice, page 180-185 and page 214, Prentice Hall, Upper Sadde River, N.J. 07458."

In various exemplary embodiments of the invention the scaffold used for the fabrication of a single nanoshell structure has no more than two molecules of the biological material. For example, the scaffold can be dipeptides, e.g., NH2-Phe-Phe-COOH dipeptides and/or NH3-Phe-Trp-COOH dipeptides.

It is to be understood, however that the use of scaffolds made of more than two molecules is not excluded from the scope of the present invention. For example, the scaffolds can be tripeptides, e.g., Boc triphenylalanine or the like.

Prior to their coating, the nanometric scaffolds of the present embodiments are preferably maintained under conditions that at least partially prevent assembly of the scaffolds into supramolecular structures.

As used herein "supramolecular structure" refers to any structure composed of sub-units connected via non-covalent interaction.

The term supramolecular structure encompasses at least any of the following structures: nanotube, nanowire.

Thus, the nanometric scaffold according to some exemplary embodiments of the invention are "elementary building blocks" of supramolecular structures each being composed of a plurality of nanoparticles bound to each other by non-covalent bonds (e.g., weak bonds such as H-bonds and bonds maintained by Van der Waals forces). The scaffolds are "elementary" in the sense that that they cannot be disassembled into their constituents, unless their covalent bonds are broken by supplying energy which at least equals their covalent bond energies. Although being elementary building blocks, the scaffolds of the present embodiments preferably remain discrete, since they are not assembled into supramolecular.

Nanometric scaffolds which are not assembled into a supramolecular or colloidal structure are referred to herein as "discrete nanometric scaffolds". In various exemplary embodiments of the invention at least 70%, or at least 80% or at least 90% or at least 95%, preferably 99% or more of the nanometric scaffolds used by the method are in the form of discrete nanometric scaffolds.

Discrete nanometric scaffolds can be provided in more than one way.

In some embodiments, the discrete nanometric scaffolds are provided as non-assembled particles. In these embodiments the raw material used for the preparation of composition includes non-assembled nanoparticles.

In some embodiments of the present invention, a top-down process is employed for providing the discrete nanometric scaffolds. In these embodiments the coating is preceded by the top-down process to provide the discrete nanometric scaffolds. The top down process can be a chemical process. For example, supramolecular or colloidal structures can be treated in inorganic solution (e.g., sulfuric acids of sufficiently low pH useful for disassembling, for example, peptide supramolecular structures), or organic solution (e.g., hexafluoro-2-propanol useful for disassembling, for example, peptide supramolecular structures). The top-down process can also be a mechanical process, e.g., treatment by ultrasound waves or the like. Also contemplated is optical disassembling wherein supramolecular or colloidal structures are irradiated with an optical field, such as UV light or the like.

In some embodiments of the present invention, the discrete nanometric scaffolds are formed by a bottom-up process. For example, a peptide material including peptide oligomers can be provided and conditions can be generated for to allow the oligomers to form discrete peptide nanoparticles. The formation of peptide nanoparticles from oligomers optionally and preferably precedes the coating operation.

Also contemplated are embodiments in which amino acid molecules are provided as nanometric scaffolds. In these embodiments, the amino acids first form peptide oligomers by dimerization, trimerization, tetramization and/or multimerization. This is optionally and preferably accomplished using an appropriate multimerization agent, such as, but not limited to, one or more fusion molecules. Thereafter, the peptide oligomers form the nanoparticles as further detailed hereinabove.

In various exemplary embodiments of the invention the discrete nanometric scaffolds are kept in a medium that at least partially prevents them from being assembled into supramolecular or colloidal structures. The medium containing the discrete nanometric scaffolds can optionally and preferably be deposited on a substrate prior to the coating.

A representative example of such medium is a polar organic solvent, and preferably a protic polar organic solvent. Examples include, but are not limited to, an alcohol having the formula ROH, where R represents an alkyl group, in particular a linear or branched alkyl group having 1-20 carbon atoms, more preferably a lower alkyl group having 1-4 carbon atoms, e.g., methanol, ethanol, propanol, isopropanol and butanol; and an acid of the formula $RC(=O)OH$, where R represents hydrogen, an alkyl group, in particular a linear or branched alkyl group having 1-20 carbon atoms, more preferably a lower alkyl group having 1-4 carbon atoms, e.g., acetic acid, ethanoic acid, propanoic acid, etc. The medium is preferably also used for diluting the sol-gel precursor prior to the addition of the particles thereto.

The coating material is selected in accordance with the application for which the formed nanoshells are to be utilized. For example, nanoshells coated with a metal (e.g., Au, Ag, Cu, Pt, Ni) or a metal compound (e.g., TiN, ITO) or bimetallic or trimetallic alloys such as silver-gold alloy can be utilized in optical devices, such as, but not limited to, optical sensors (e.g., image sensor) and solar cells (e.g., photovoltaic cells). Nanoshells made of a ferromagnetic material, e.g., CoPtCrB, CoPtCrTa, CoCrPt-oxide, FePt, CoPt, $SmCo_5$, $Nd_2Fe_{14}B$, gamma ferric oxide (e.g., $Fe_2O_3$) can be utilized in magnetic memory devices.

Nanoshells can be coated with "classical" semiconductor materials possessing direct band gap, e.g., GaAs, GaN, GaSb, CdSe, etc. In the case of nanoshells, having quantum size, they can be also made of indirect bad gap semiconductors such as Si, Ge or metals such as Au, Ag, Cu, etc. These nanoshells can be utilized in light detecting devices (optical detectors) and light emitting (LED) devices, for example displays and flexible display devices, luminescent biomarkers, etc.

The deposition of the coating material on the cores can be executed to form a single coating layer on the core, or alternatively two or more coating layers. When several layers are formed, two adjacent layers can be deposited using different or same materials, as desired. The thickness and/or materials of the layer(s) can be selected in accordance with the application form which the nanoshells are to be utilized. For example, for optical applications, the thickness of the layer(s) and the ratio between thicknesses can be selected so as to provide nanoshells with predetermined optical properties (e.g., resonance frequency for plasmonic applications) or nanoshells of quantum size with thickness of the layer(s) and ratio between thicknesses of layers selected so as to provide nanoshells with various properties, including but not limited to nanoshells capable of generating luminescence (light emission) or detecting light in desired spectral regions (infrared, visible, ultraviolet).

For some applications, e.g., in the field of memory devices, particularly charge memory devices, a first dielectric layer can be deposited onto the scaffold and a second, different, dielectric layer can be deposited on the first dielectric layer. The dielectric materials of the two layers can be selected to facilitate charge trapping at the interface between the layers. A representative example for the first dielectric material includes, without limitation, $Si_3N_4$, and representative examples for the second dielectric material include, without limitation, $SiO_2$, $HfO_2$ and $TiO_2$.

Deposition of a plurality of layers is particularly useful for the fabrication of hollow nanoshells having, in the shell, one or more inner layers made of a dielectric material and an outer layer made of a conductive material such as metal. Other combinations (e.g., metal-dielectric-metal, dielectric-metal-metal, dielectric-metal-dielectric) are not excluded from the scope of the present invention.

The non-chemical treatment applied at 12 is preferably selected to decompose the sacrificial nanometric scaffolds.

In some embodiments of the present invention the treatment includes a thermal treatment which decomposes the scaffolds. The thermal treatment can be executed in open air, or in some medium, preferably gaseous medium, e.g., ozone. The employed temperature depends on the material from which the scaffolds are formed. For example, the core-shell structures can be subjected to a calcination process. Suitable temperatures for decomposing the scaffolds are typically from about 300° C. to about 600° C. Other temperatures are not excluded from the scope of the present invention. A typical time-period for the thermal treatment is, without limitation, from about 30 minutes to about 120 minutes.

In some embodiment, the treatment includes applying optical radiation, such as, but not limited to, ultraviolet radiation which is known to decompose certain types of organic materials, particularly peptides, proteins and the like.

Once the scaffolds are decomposed, the shells become hollow. Residual carbon from the decomposed organic scaffolds optionally sediment on the internal walls of the shell structures.

FIGS. 3A-B and 4A-E are schematic illustration of a process suitable for forming a plurality of nanoshell structures on a substrate according to some embodiments of the present invention.

Figure 3A:
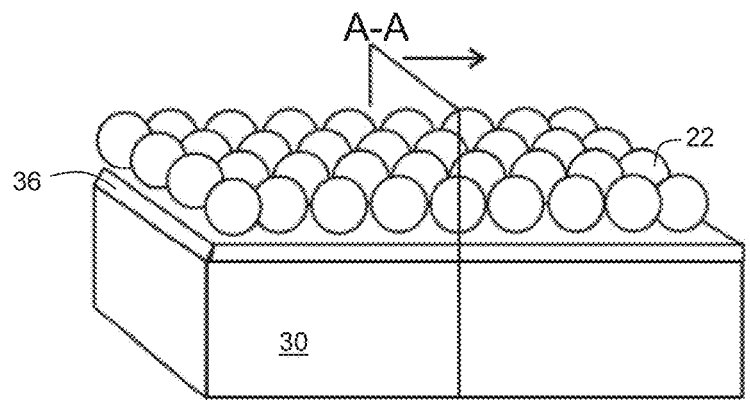
FIGS. 3A and 3B are perspective views showing a plurality of nanometric scaffolds on a surface of a substrate, according to some embodiments of the present invention.
Figure 3B:
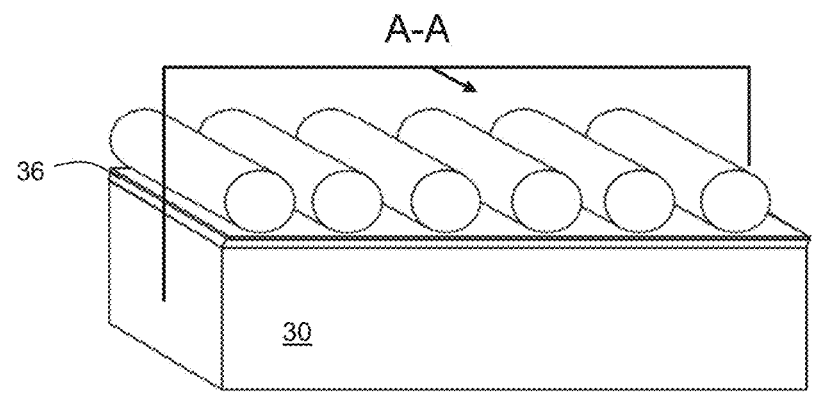

FIGS. 3A and 3B are perspective views showing a plurality of nanometric scaffolds 22 on a surface of a substrate

30. In FIG. 3A the scaffolds have a generally spherical shape and in FIG. 3B the scaffolds have a tubular (e.g., cylindrical) shape.

Substrate 30 can be, for example, a silicon on isolator (SIO) substrate or the like. Substrate 30 can include an oxide film 36 (e.g., an SiO$_2$ film) on which scaffolds 22 can be deposited, substrate or the like. The thickness of film 36 can be from about 30 Angstroms to about 100 30 Angstroms (e.g., about 70 30 Angstroms).

Tubular shape scaffolds can be formed by self-ordering or they can be patterned onto the surface of substrate 30. For example, a nano-pen device or an atomic force microscope (AFM) probe tip coated with a chemical containing, e.g., amino acids selected to form peptide nanotubes, can be employed. When the nano-pen device or probe is placed in contact with a surface of substrate 30, a meniscus forms and provides a pathway for the amino acid molecules to diffuse from the probe tip to the surface where they self organize at the surface of the underlying tunnel oxide layer.

Figure 4A:
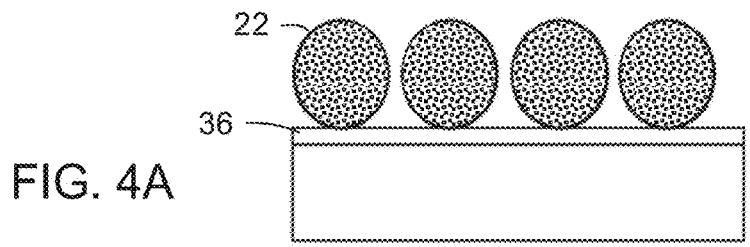
FIGS. 4A-E are schematic illustrations of a process suitable for forming a plurality of nanoshell structures on a substrate, according to some embodiments of the present invention.
Figure 4B:
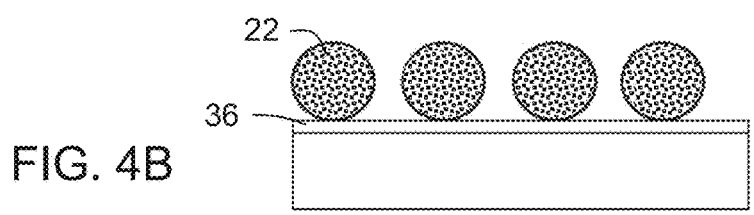
Figure 4C:
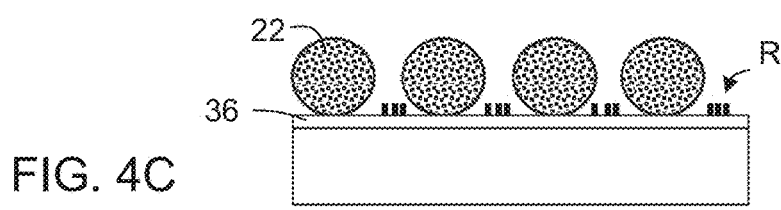
Figure 4D:
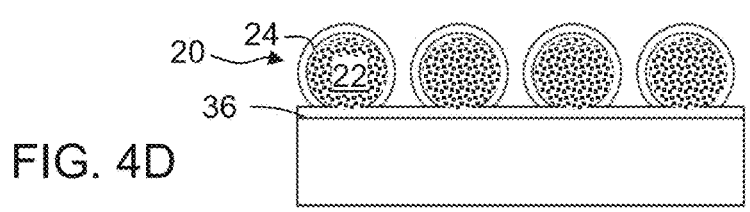

FIGS. 4A-E illustrate cross-sectional view of substrate 30 showing a plane designated A-A in FIGS. 3A and 3B. FIG. 4A illustrates scaffolds 22 once deposited. Scaffolds 22 can undergo initial heating (bake), as a result of which their size decreases (FIG. 4B). Without wishing to be bound to any particular theory, it is assumed that the size is decreased due to removal of some of the bound water molecules are removed, and/or loss of cores. The surface of film 36 is optionally and preferably treated in a hydrophobizing agent, which can be or include, for example, a silane coupling agent such as, but not limited to, hexamethyldisilazane (HMDS), octadecyltrichlorosilane (OTS) or the like (FIG. 4C). In experiments performed by the present inventors specimens with deposited scaffolds were placed in a saturated HMDS vapors at room temperature for a period of about 24 hours. This resulted in an increment of the contact angle from about 30° to about 70°. The advantage of this hydrophobization is that it reduces the likelihood or prevents ALD process directly on film 36. The hydrophobicity of film 36 is illustrated in FIG. 4C in the form of adsorbed radicals "R." In experiments performed by the present inventors no pronounced changes in further ALD deposition rates were observed, indicating that the scaffold is not hydrophobic after the treatment. For some devices, particularly optical devices, it is not necessary to achieve selectivity to SiO$_2$ during the coating (e.g., by ALD), since thin metal layer of several nm at the flat surface of SiO2 is transparent to light.

Figure 4E:
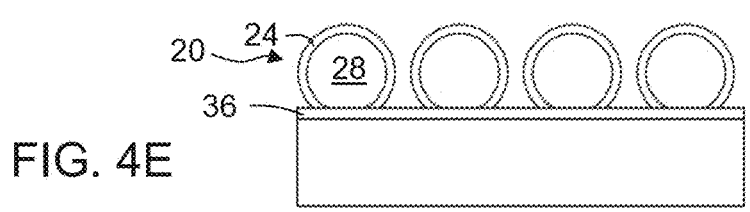

The surface of scaffolds 22 is then coated, e.g., by ALD process layer (FIG. 4D), resulting in a plurality of core-shell structures 20, each having a core 22 and a shell 24. Thereafter, the core-shell structures are treated to remove the sacrificial; scaffolds (FIG. 4E).

The formed nanoshell structures can have any shape.

In some exemplary embodiments of the invention the nanoshell structures are generally spherical.

As used herein "generally spherical" refers to a shape characterized by a sphericity of at least 0.7, more preferably at least 0.8 more preferably at least 0.9, e.g., 0.95 or 1.

The sphericity of an object is defined as the ratio between the surface area of a sphere having the same volume as the object and the surface area of the object.

For nanometric objects, it is oftentimes more convenient to estimate the average sphericity of a plurality of objects using a two-dimensional image (typically an electron microscope image) of the objects, wherein the orientations of the objects vary statistically thereamongst. From the two-dimensional image, the dimensions of each object across two directions parallel to the image plane (e.g., the largest dimension and smallest dimensions, or the largest dimension and the dimension along a direction orthogonal to the largest dimension, or the smallest dimension and the dimension along a direction orthogonal to the largest dimension) can be measured. An aspect ratio can then be calculated for each object as the ratio between the smaller measured dimension and the larger measured dimension, and the sphericity can be estimated as this ratio.

In various exemplary embodiments of the invention at least 70% or at least 80% or at least 90% or at least 95% or at least 99% of the nanoshell structures are generally spherical.

In various exemplary embodiments of the invention X % of the nanoshell structures are characterized by an aspect ratio of at least 0.7, more preferably at least 0.8 more preferably at least 0.9, e.g., 0.95 or 1, where X is at least 70 at least 80 or at least 90 or at least 95 or at least 99.

In some exemplary embodiments of the invention the nanoshell structures are tubular.

As used herein "tubular" refers to a hollow structure having a length which is greater than its diameter (e.g., at least 2 times or at least 3 times or at least 4 times or at least 5 times or at least 10 times). A tubular nanoshell structure can have a generally constant cross-sectional shape along its length. For example, a tubular nanoshell structure can have a cylindrical shape. A tubular nanoshell structure can have a cross-sectional shape which varies in its shape and/or size along the length of structure. For example, a tubular nanoshell structure can have a generally conical shape.

In some exemplary embodiments of the invention the nanoshell structures have irregular shape. Typically, but not necessarily, the irregular shape is characterized by non-constant sectional curvature.

The nanoshell structures of the present embodiments are useful for many applications. Representative examples for devices in which the nanoshell structures of the present embodiments can be incorporated including, without limitation, an optical device, such as, but not limited to, an image sensor (e.g., CMOS image sensor and a CCD image sensor), a solar cell, a photovoltaic cell, a light emitting device, a display (e.g., a flat display, more preferably a flexible flat display), a transistor device, e.g., a Field Effect Transistor (FET) device, a memory device, a magnetic memory device, a NAND memory array, a NOR memory array and an energy storage device (e.g., an electrochemical device, a supercapacitor).

For example, metallic nanoshells effectively interact with light due to collective oscillations of the conduction electrons known as surface plasmons (SPs). The effect has a resonant nature. The corresponding resonant peak energies and line widths depend upon nanodot composition, size, shape and environment. When placed close to the surface of semiconductor imagers or solar cells, the nanoshells structure optionally and preferably can influence the light absorption performance by first converting the light into resonant SPs and then irradiating the photons at different angles. The advantage is higher absorption of light and spectral sensitivity. This is particularly useful when the nanoshell structures are employed in pixels of CMOS image sensors or in solar cells. The resonance performance of the nanoshell structures can be tuned by selecting the shell thickness thus making the nanoshell structures sensitive to different wavelengths.

In the presence of the oscillating electromagnetic field of light, the free electrons of the metal nanoshell undergo collective coherent oscillations with respect to the positive metallic lattice. This process is resonant at a particular frequency of the light oscillation can be considered as a photon confined in the nanoshell. As a result, an intense electric field is created around the nanoshell. The enhancement is sufficiently strong to effect SP induced hot electron flow into the surrounding medium.

The SP oscillations decay by radiating the energy. This is a light scattering effect. Some of SPs can also emit heat. For large sizes of the nanoshell structured (compared with the wavelength of light), the Mie theory is applicable. The resonant energy peak experiences the red shift with increasing size, and the radiative scattering of SP energy results in significant broadening of the resonance lines. For particle sizes below 200 angstroms in diameter various additional physical effects influence SP generation and scattering. These include, size dependent modification of the dielectric constant (compared to the bulk values), enhanced surface effects, and the like. The plasmon lines can be broadened also by the fluctuations of particle shape and size.

Light absorption due to surface plasmons in metal nanoparticles leads to: (i) enhanced light scattering; (ii) strong near field effects, (iii) an increase of far field absorption due to the resonance nature of the absorption effects. In particular, the light absorption of the photosensitive semiconductor material can be strongly influenced by placing nanodots at its surface. For example, metal particles incorporated in the photo-active area of solar cells or semiconductor imagers result in enhanced light absorption. This happens not only due to intense near fields at distances much smaller than the wavelengths of light, but also at far distances from the nanoshells, because of the resonant nature of light absorption. The absorption and scattering effects (spectral sensitivity, % of enhanced absorption vs % of increased scattered light, etc.) depend on the type of nanoshells, their size and shape. Most metals and semiconductors are reflecting IR and visible light because their plasmon frequencies are in the ultraviolet. Metals having resonances in the visible light are typically gold, silver and copper. Since copper is easily oxidized, gold and silver nanoshell structures are preferred in optical applications in the visible region. Other metals (e.g., Pt, Ni for visible or UV range, Al for IR range), various metal alloys, metallic compounds and semiconductors are also promising as SP materials, e.g., TiN, ITO (indium-tin-oxide), are not excluded from the scope of the present invention. These metals have resonances in mid-visible to IR ranges.

The resonance frequency of SP can be tuned by selecting the size, shape, and/or composition of the nanoshell structure, and also environment. For example, Au nanospheres in the 10-nm size range have a strong absorption maximum around 520 nm while feature the peak shifts to 530 nm for 40 nm diameter. At the same time, the effect may be much stronger if the metal nanoparticles have a core-shell structure, for example, a metal coating on a spherical core. Such a core can be organic or inorganic where the gold shells were formed on silica particles.

Figure 5:
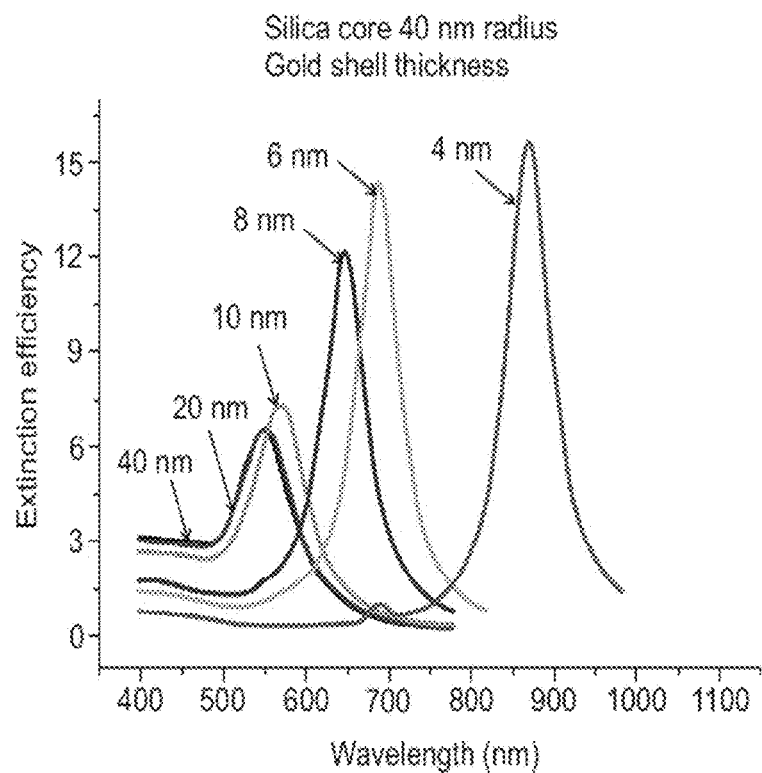
FIG. 5 shows plasmon resonance frequency of silica core-gold nanoshells.

FIG. 5 shows plasmon resonance frequency of silica core-gold nanoshells. As shown, the plasmon resonance frequency is tunable from the visible to the NIR by changing the shell thickness relative to the core size. This is used in different biological nanoprobes and also cancer therapy for creating nanodots attached to cancer cells that can then be heated by IR radiation to destroy cancer cells.

The plasmon resonance of the nanoshell structures of the present embodiments in proximity of light sensitive material has several advantages. For example, metal nanoshell structures according to some embodiments of the present invention can be placed over, e.g., silicon imager, to focus the incident light onto the photoelectric conversion region. The absorption of light in the photosensitive layer is made higher than in the absence of nanoshell structures. Such construction is found, for example, in U.S. Published Application No. 20090146198 and U.S. Pat. No. 8,143,685, the contents of which are hereby incorporated by reference.

Luminescence of specially introduced dye molecules can be used to obtain more light further directed into the imager. The incoming light is absorbed by nanoshell structures to excite SP oscillations. These, in turn, stimulate luminescence of the material placed in the near field region. As a result, some of the energy previously dissipated as heat is now converted into light. The effect depends on the distance from the luminescent substance and the nanoshell structures. Because of SP enhancement, the optical cross-section of the metal nanoshell structures of the present embodiments can be several orders of magnitudes (e.g., two, three, four, five or more) higher than that of the dye molecules (see, e.g., U.S. Pat. No. 8,054,671).

Semiconductor image sensor is a photoelectric transducer that converts light into an electric signal. To date, two basic types of imagers are recognized: CMOS (complementary metal oxide semiconductor) image sensors and CCD (charge coupled devices). A conventional image sensor includes a plurality of pixels arranged in an array on a semiconductor substrate. Each unit pixel includes a photodiode that is sensitive to light. CCD and CMOS imagers differ in their readout technique.

In CCD, the generated by light charge is transferred along lines and columns to the exit register for amplification. CMOS imager is an active pixel imager featuring signal amplification by transistors belonging to a certain pixel. In CMOS image sensors, pixels can be formed at a single chip together with various signal processing devices. It is recognized that the resolution of imagers can be increased by increasing the number of pixels.

Typical modern imagers have pixel sizes in the range of 0.5-2 μm. For small size pixels, the amount of light reaching the photodiodes significantly affects the performance of the imager. This amount can be increased using microlenses that focus the light onto the photodiode, rather than on the transistors in a CIS pixel, or service spaces in CCDs. Another known technique employs back-side illuminated imagers. In this technique, the CMOS or CCD circuit is formed at the front side of a wafer. To avoid shading of part of the photodiode area by metallization, an opening is etched at the back side of the wafer, and light is intruded from the back side where there is no metallization. Typically, silicon on oxide (SOI) wafers are used for this purpose, so that the etching from the back side is stopped at the SOI buried oxide. The remaining silicon thickness is on the order of several microns which is less than the diffusion length from which the electrons are collected into the photodiodes of the imager. Focusing light onto a photoelectric conversion region using the microlenses is used also in this case, though it is difficult when the photoelectric conversion region is sub-micron size.

The nanoshell structures of the present embodiments can also be utilized in a solar cell.

A typical solar cell or photoelectrical converter comprises a p-n junction where the electrons and holes generated by the absorbed light are separated thus leading to photocurrents. The electrons and holes are collected by the p-n junction from the volume where the light quanta had been absorbed. The absorption length of red-IR photons in silicon are tens-hundreds of microns. It is generally desired to make the body of a solar cell as thin as possible, so as to save on silicon cost. The enhanced absorption of light provided by the SP resonance of the nanoshells structures of the present embodiments, and also the scattering in lateral direction increases the absorption length and improves the performances of the solar cell.

The present Inventors found several problems associated with conventional nanotechnology techniques.

Some known techniques of metal nanodot deposition often include sputtering of thin metal layers and then RTP treatment to segregate the deposited nanometer thick metal film into nanoclusters. It was found by the present inventors that when using techniques based on segregation, it is difficult to control the size of nanoclusters and their spatial distribution. U.S. Pat. No. 7,928,503, 2010 discloses regular chaperonin protein structure with natural 45 A voids deposited onto the bottom oxide of the NVM transistor and used to trap externally generated nanocrystals. It was found by the present inventors that not all of the voids trap the nanoparticles, even if these particles are of the same size. Additional problems associated with utilization of nanoclusters relate to the integration. It was found by the present inventors that many nanocluster compositions are incompatible with temperatures necessary to fabricate electronic systems. For example, the typical maximum temperatures in the Back End (forming interconnections) of a typical VLSI circuit are about 400° C. At this temperature, most biological substances decompose.

Figure 6:
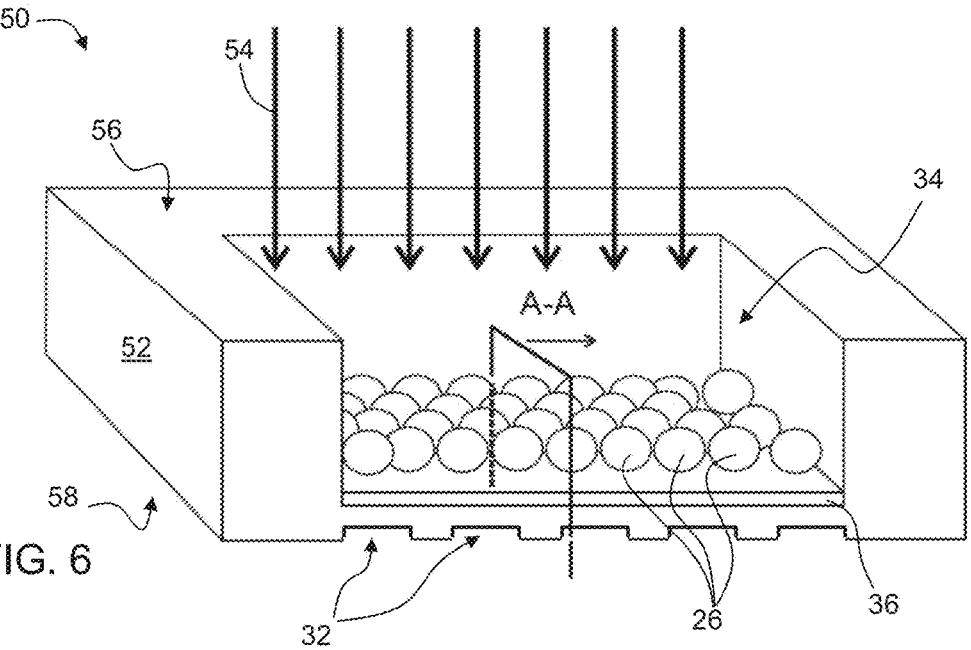
FIG. 6 is a schematic illustration of an optical device according to some embodiments of the present invention.

A representative embodiment of an optical device 50 according to some embodiments of the present invention is schematically illustrated in FIG. 6. Device 50 is preferably a back-illuminated optical device having a plurality of imager pixels 32 on its front side 58 and being configured for receiving light 54 from its back side 56. A wafer 52 (shown face down in FIG. 6) having a buried oxide 36 film is formed with a plurality of imager pixels 32, as known in the art. The wafer can be, for example, an SOI (silicon on isolator) wafer or the like. A recess 34 is formed made back side 56 of wafer 52, e.g., by etching. The etch stop is optionally and preferably on at buried oxide film 36. The sacrificial nanometric scaffolds are then deposited in the recess 34 and the method of the present embodiments is applied to from nanoshell structures 26, as further detailed hereinabove (see, e.g., FIGS. 1, 3A and 4A-E). Schematic illustrations of a preferred process for forming the nanoshell structures 26 are shown in FIGS. 4A-E, which are to be understood as cross-sectional views along a plane designated A-A in FIG. 6.

Device 50 can also include tubular nanoshell structures instead of, or in addition to, the spherical nanoshell structures shown in FIG. 6. In these embodiments, tubular scaffolds are formed in recess 34 similarly to as describe above with respect to FIG. 3B. Line width of less than 50 nm can be produced while the nanotubes can be placed over the pixels, e.g., one or several nanotubes in the area of a single pixel, and the process can continue as described above with respect to FIGS. 4A-E.

Figure 7:
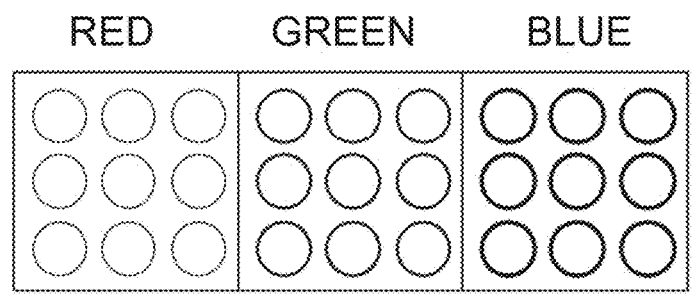
FIG. 7 is a schematic illustration of three sub-pixels, each configured to interact with light of different wavelength, according to some embodiments of the present invention.

The optical device of the present embodiments can be designed and configured for capturing color images. The concept is illustrated in FIG. 7. A picture-element (e.g., pixel) is divided into several (e.g., three or more) sub-pixel areas. Nanoshell structures of the same size occupy the pixel area, but the thickness of the metal shell in each sub-pixel differs from the thickness of the metal shell in all other thicknesses. For example, a first sub-pixel area can be configured for absorbing red light, a second sub-pixel area can be configured for absorbing green light, and a third sub-pixel area can be configured for absorbing blue light, as schematically illustrated in FIG. 7. Generally, thicker shell thickness corresponds to absorption of shorter waves.

Figure 8A:
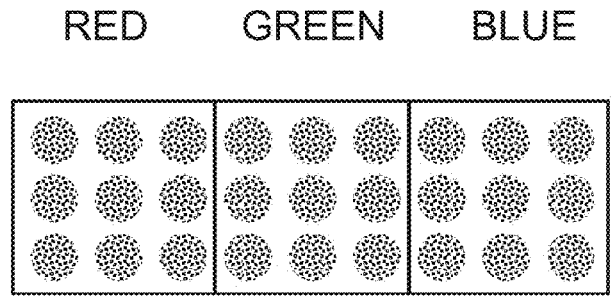
FIGS. 8A-D are schematic illustrations of a process for fabricating the sub-pixels of FIG. 7.
Figure 8B:
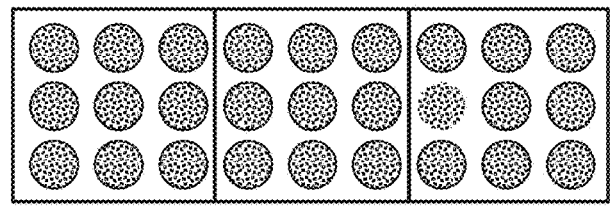
Figure 8C:
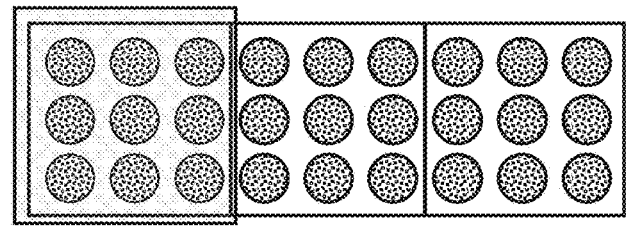
Figure 8D:
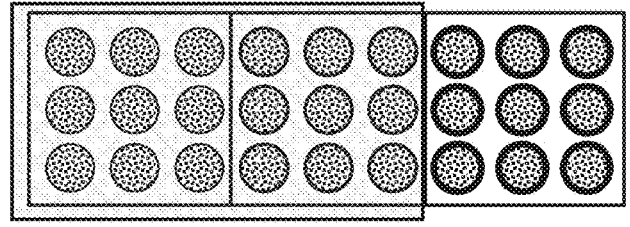

A preferred process for fabricating a color imager is illustrated in FIGS. 8A-D, for the case of red, green and blue sub-pixels. Sacrificial nanometric scaffolds are deposited on the surface of all three sub-pixels (FIG. 8A). The surfaces of the nanometric scaffolds are coated by a metal to form a shell of a first thickness (FIG. 8B). For example, an ITO layer at thickness of about 10 nm can be deposited. A mask is then applied to cover the sub-pixel corresponding to the Red color (FIG. 8C). The coating operation is then repeated for the green and blue sub-pixels but not for the red sub-pixel. For example, an ITO layer at thickness of about 30 nm can be deposited. A mask is then applied to cover the sub-pixels corresponding to the Red and Green colors, and the coating operation can be repeated for blue sub-pixel but not for the red and green sub-pixels. For example, an ITO layer at thickness of about 50 nm can be deposited. Once the masks are removed, the thickness of the nanoshell structures of the red sub-pixels is less than the thickness of the nanoshell structures of the green sub-pixels, and the thickness of the nanoshell structures of the green sub-pixels is less than the thickness of the nanoshell structures of the blue sub-pixels.

The mask can be made of photoresist (low temperature ALD deposition on the exposed surface and resist). In this case lift-off technology is preferably employed. The mask also can be a hard mask, made of, e.g., SiN. In this case an etching procedure selective to the nanoshells and $SiO_2$ can be employed.

The nanoshell structures of the present embodiments are also useful for the fabrication of memory devices, particularly charge memory devices, preferably non-volatile memory devices.

Figure 9:
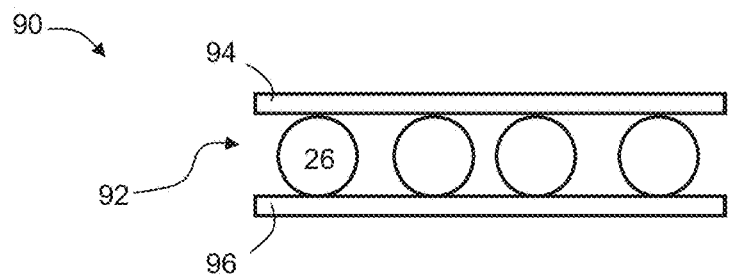
FIG. 9 is a schematic illustration of a charge storage device according to some embodiments of the present invention.

A representative charge storage device 90 is illustrated in FIG. 9. Device 90 comprises a memory layer 92 between a first layer 94 and a second layer 96, wherein first layer 94 and second layer 96 are configured to apply an electrical bias to memory layer 92, and wherein memory layer 92 comprises a plurality of nanoshell structures 26 as further detailed hereinabove. Preferably, nanoshell structures 26 are separated from each other, wherein regions between at least a few of nanoshell structures 26 are devoid of material forming an outer surface of nanoshell structures 26.

Figure 10A:
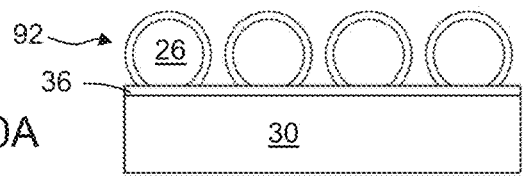
FIGS. 10A-D are schematic illustrations of a process for fabricating a charge storage device according to some embodiments of the present invention.
Figure 10B:
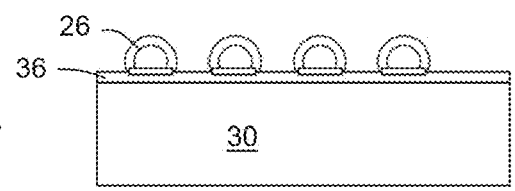

A preferred process for fabricating a charge storage device is illustrated in FIGS. 10A-D. FIG. 10A illustrates a plurality of nanoshells structures 26 on a substrate 30. The nanoshells structures can be fabricated be executing the operations described above with respect to FIGS. 4A-E. Optionally and preferably, the nanoshell structures are densificated (FIG. 10B). For example, a thermal treatment can be applied. A representative example of a thermal treatment is RTP at 700-800° C. As a result, the size of the nanoshell structures further decreases. This may facilitate further processing (e.g., larger spaces for gas flow in subsequent control gate ALD dielectric deposition).

Figure 10C:
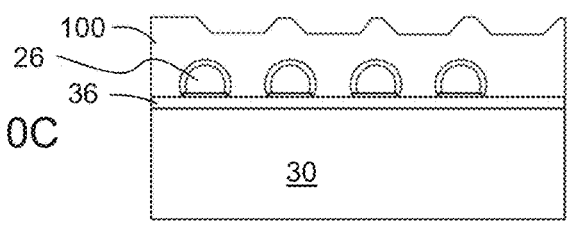
Figure 10D:
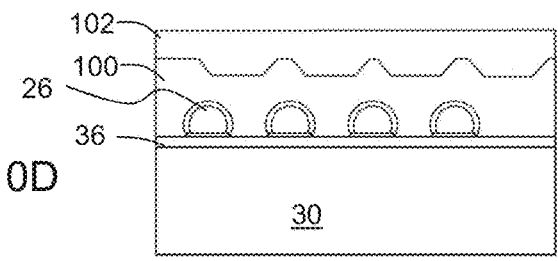

The nanoshell structures and substrate are optionally and preferably covered with additional dielectric layer 100, for example, by CVD or ALD (FIG. 10C). The dielectric layer can be made, for example, from $Al_2O_3$, $HfO_2$ and the like. A top electrode 102 can then be applied on layer 100 (FIG. 10D). Electrode 102 can serve as a control gate. Electrode 102 can include, for example, a MOS capacitor or MOS transistor having a floating gate. In this respect, an organic floating gate utilizing bio-organic nanodots can be employed. The top electrode 102 can be a polysilicon electrode.

As shown in FIG. 10D, the upper surface of nanoshells 26 is larger than the surface facing the bottom film 36. This results in higher coupling ratio of the control gate. As a result, low programming/erase voltages compared with "flat" floating gates in charge trapping NVM are achieved. When the material of the shell does not cover film 36 under the nanoshell structure (see FIG. 10A), the control gate coupling is even higher.

Figure 11A:
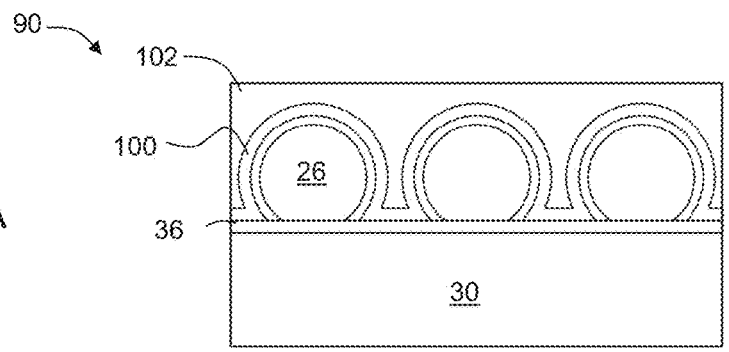
FIGS. 11A-B are schematic illustration of a charge storage device having improved control gate coupling, according to some embodiments of the present invention.
Figure 11B:
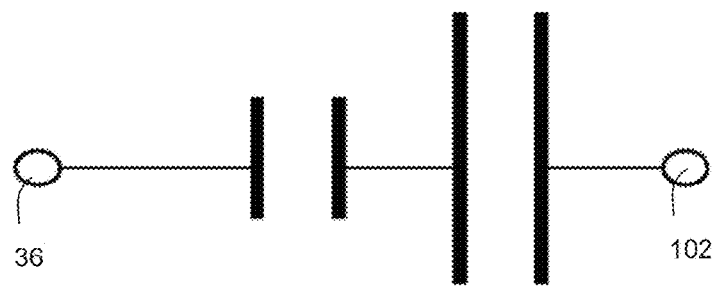

The coupling can be further increased using larger nanoshell structures (e,g., several hundreds of Angstroms in diameters). This is illustrated in FIGS. 11A-B, where FIG. 11A illustrates the charge memory device and FIG. 11B illustrates the analogue capacitance diagram.

Figure 12:
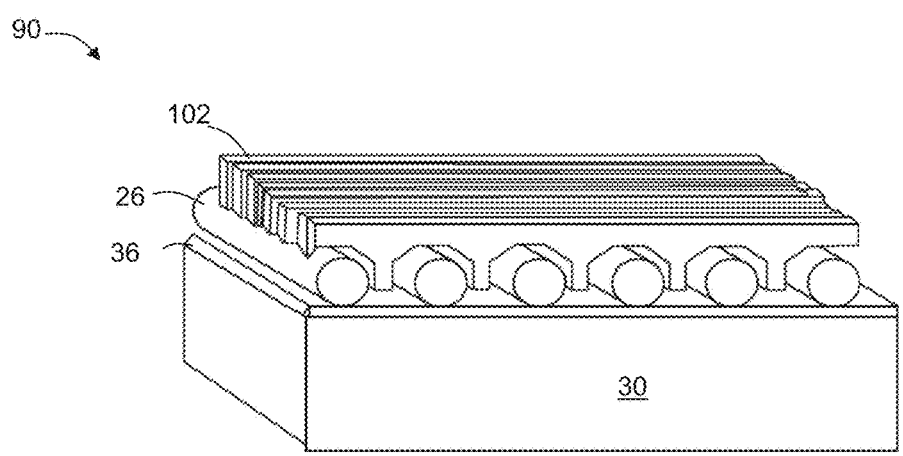
FIG. 12 is a schematic illustration of a charge storage device in an embodiment of the invention in which the nanoshells structures are shaped as tubes.

FIG. 12 illustrates an embodiment of the invention in which the nanoshells structures 26 are shaped as tubes, as further detailed hereinabove. Optional layer 100 (see FIGS. 10C, 10D and 11A) is not shown for clarity of presentation and should be understood is interposed between tubular nanoshells 26 and top layer 102. Following the coating of the tubular scaffolds, CMOS temperatures can be allowed in the integration. The dielectric thickness can be sufficiently thick (e.g., from about 100 to about 200 Angstroms of Alumina) to provide good retention.

Device 90 can be integrated into many types of circuitries and arrays.

Figure 21:
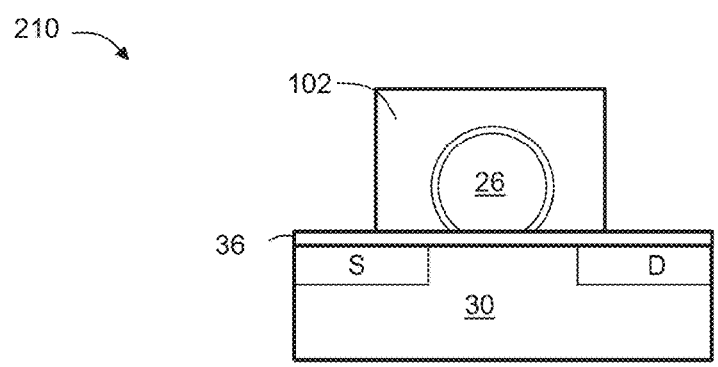
FIG. 21 is a schematic illustration of a transistor device, according to some embodiments of the present invention.

FIG. 21 is a schematic illustration of a transistor device 210, according to some embodiments of the present invention. Transistor device 210 is optionally and preferably a FET device. Nanoshell structure 26 is formed on oxide layer 36 above substrate 30. Two doped regions S and D (typically, but not exclusively N+ type) are formed in substrate 30 at both sides of nanoshell structure 26, and a top electrode 102 covers nanoshell structure 26 and optionally also oxide layer 36 or part thereof. Electrode 102 can serve as a control gate, and doped regions S and D can serve as a source and drain regions for transistor device 210. Voltage levels applied to the source region, drain region and control gate can be selected to allow or prevent flow of charge carriers between the source and the drain, as known in the art.

Figure 22:
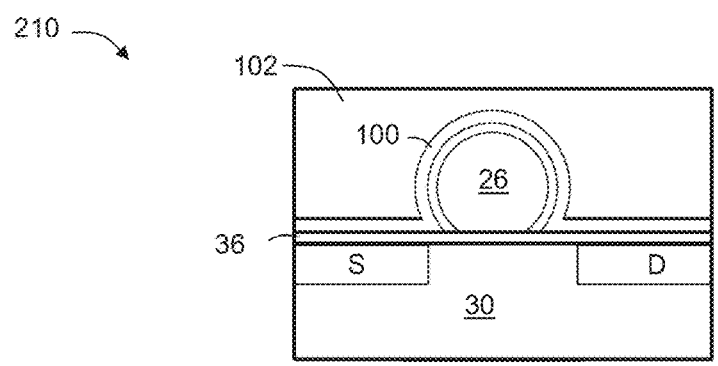
FIG. 22 is a schematic illustration of a transistor device, in embodiments of the invention in which the device also has a floating gate.

FIG. 22 is a schematic illustration of a transistor device 210, in embodiments of the invention in which device 210 also has a floating gate. These embodiments are similar to those described above with respect to FIG. 21, except that an additional dielectric layer 100 covers nanoshell structure 26 so that the control gate layer 102 is on top of layer 100. As will be appreciate by one of ordinary skill in the art, this allows the shell of nanoshell structure 26 to function as a floating gate. Voltage levels applied to the source region, drain region and control gate can be selected to allow or prevent flow of charge carriers between the source and the drain, and further to allow charge carriers to overcome the potential barrier of layer 36. Thus, when the charge carriers tunnel into nanoshell structure 26 they are stored (the floating gate is programmed) and when the charge carriers tunnel back into substrate 30 they are released (the floating gate is erased).

The transistor in FIG. 22 can be advantageously incorporated in a memory array, e.g., a NAND array or NOR array as known in the art. For example, a plurality of word lines can be arranged to intersect with a plurality of bit lines, where at each intersection of word lines and bit lines a floating gate transistor device such as device 210 can be formed. Prior to the first word line and after the last word line a select gate drain and the select gate source can be formed along the bit line. Each floating gate transistor device is optionally and preferably connected to the next floating gate transistor device by connecting the source of one device to the drain of the next device.

Figure 13A:
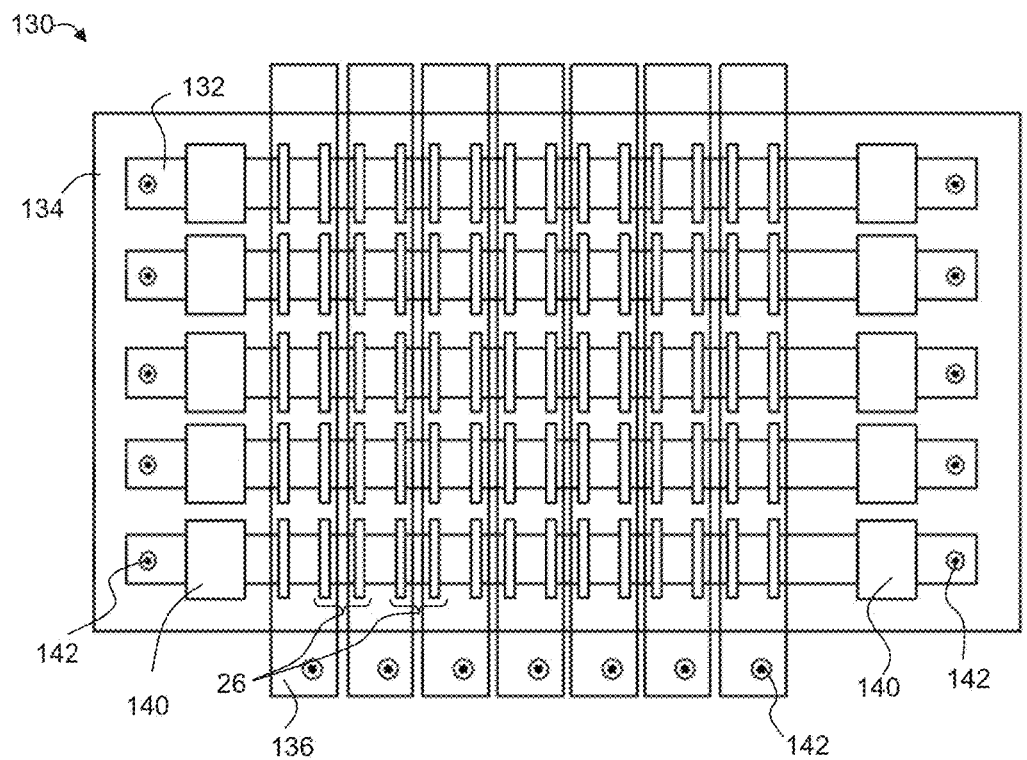
FIGS. 13A-B are schematic illustrations of a NAND memory array based on tubular nanoshell structures, according to some embodiments of the present invention.
Figure 13B:
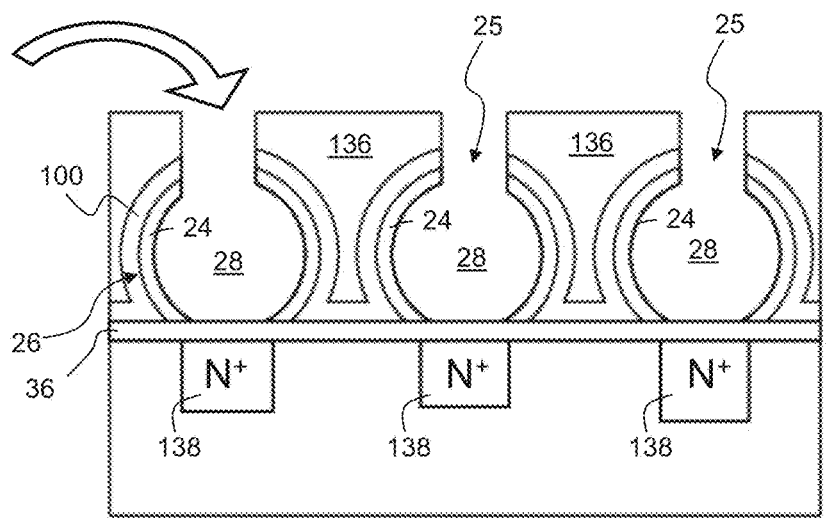

FIGS. 13A and 13B schematically illustrate a NAND memory array 130, according to some embodiments of the present invention.

In the present embodiments, the nanoshell structures only partially enclose the internal voids 28, such that there are openings 25 in shells 24. In these embodiments, nanoshell structures are optionally and preferably sufficiently large so as to allow the formation of the opening 25 as further detailed hereinbelow. Typical diameter of nanoshell structures 26 suitable for the present embodiments are from about 50 nm to about 300 nm, e.g., about 100 nm.

Array 130 comprises a plurality of nanoshells structures 26 arranged on active stripes 132 of a semiconductor material, wherein two adjacent active stripes 132 are separated by an isolating region 134. In the representative illustration of FIG. 13A, nanoshell structures are shown as tubular nanoshell structures. But this need not necessarily be the case, since, for some applications, it may not be necessary for the nanoshell structures to be tubular.

Active stripes 132 serve as the bit lines of array 130. Word lines 136 (shown transparent in FIG. 13A) are arranged perpendicular to the active stripes 132 such that the intersect region between a word line and an active stripe defines a cell of the array. A contact region 142 is formed near the end of each word line, and optionally and preferably at both ends of each bit line. Array 130 also comprises a bit line select gate 140 at each end of the bit lines 132.

Two adjacent cells along a bit line share a nano shell structure 26 such that the opening 25 in shell 24 of nanoshell structure 26 is between the adjacent cells. Each cell is therefore shared by two adjacent nanoshell structures, which sever as a pair of floating gates for the respective cell. A cross-sectional view of array 130 is illustrated in FIG. 13B. Each nanoshell structure 26 is above a doped (typically, but not exclusively N$^+$ type) source/drain region 138, so that two adjacent cells of array 130 along a bit line share a source/drain region, and each cell is between two source/drain regions. Thus, a particular cell of array 130 forms a transistor, and the cells along a bit line form a NAND string, wherein select gates 140 can selectively couple opposite ends of each NAND string to the respective bit line.

Each cell in array 130 can serve as a double density non-volatile memory cell configured for storing two bits of information. In accordance with some embodiments of the present invention, a single cell of array 130 operates as follows to implement read, write and erase operations.

The left floating gate of the cell can be programmed by selecting the voltages applied to the word line and source/drain regions at both sides of the cell such as to accelerate electrons from the left source/drain region to the right source/drain region, and to provide some electrons near the right source/drain region sufficient energy to overcome the potential barrier and be trapped in the right floating gate region. Since the floating gate is isolated, the injected charge remains within the floating gate region.

The right floating gate of the cell can be programmed in a reversed manner by selecting the voltages applied to the word line and source/drain regions at both sides of the cell such as to accelerate electrons from the right source/drain region to the left source/drain region, and to provide some electrons near the left source/drain region sufficient energy to overcome the potential barrier and be trapped in the left floating gate region. Since the floating gate is isolated, the injected charge remains within the floating gate region.

The left floating gate can be read by selecting the voltages applied to the word line and source/drain regions at both sides of the cell such that the cell conducts current if and only if a charge is stored in the right floating gate. The right floating gate region can be read in a reverse manner, by applying voltages such that the cell conducts current if and only if a charge is stored in the left floating gate.

The left floating gate can be erased by selecting the voltages applied to the word line and source/drain regions at both sides of the cell such that the trapped charge in the left floating gate overcomes the potential barrier and passes into the channel between the two source/drain regions.

Representative voltage selections, which are not to be considered is limiting are as follows.

The left floating gate of the cell can be programmed by connecting the source/drain region under the left nanoshell structure of the cell to about 5 Volts, connecting the source/drain region under the right nanoshell structure to ground, and connecting the word line above the cell to a voltage of about 10 Volts. The right floating gate of the cell can be programmed by connecting the source/drain region under the right nanoshell structure of the cell to about 5 Volts, connecting the source/drain region under the left nanoshell structure to ground, and connecting the word line above the cell to about 10 Volts.

The right floating gate can be read by applying 0 Volts to the right source/drain region, about 2 Volts to the left source/drain region, and about 3 volts to the word line. The left floating gate region can be read by applying 0 Volts to the left source/drain region, about 2 Volts to the right source/drain region, and about 3 volts to the word line.

The right floating gate region can be erased by applying 0 Volts to the word line, about 8 Volts to the right source/drain region and about 3 Volts to the left source/drain region. The left floating gate region can be erased by applying 0 Volts to the word line, about 8 Volts to the left source/drain region, and about 3 Volts to the right source/drain region.

Other voltage values are not excluded from the scope of the present invention.

Each cell of array 130 can be controlled judiciously application of voltages to the respective bit lines and word lines. Generally, for addressing a cell c defined by the intersection of bit line b and word line w, sufficiently high voltage is applied to all the world lines other than w such as to make the respective cells on bit line b conductive. Read, program and erase operations for cell c can then be executed by applying voltages to bit line b and world line w, as described above. These operations are well-known to those skilled in the art of NAND memories.

Figure 14A:
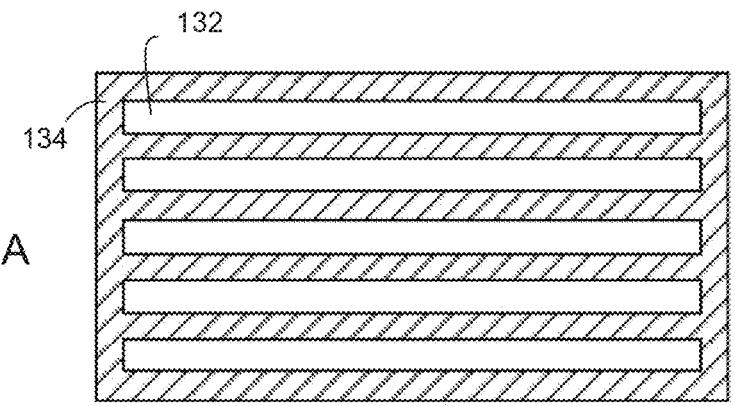
FIGS. 14A-C are schematic illustrations of a process suitable for forming a NAND memory array, according to some embodiments of the present invention.
Figure 14B:
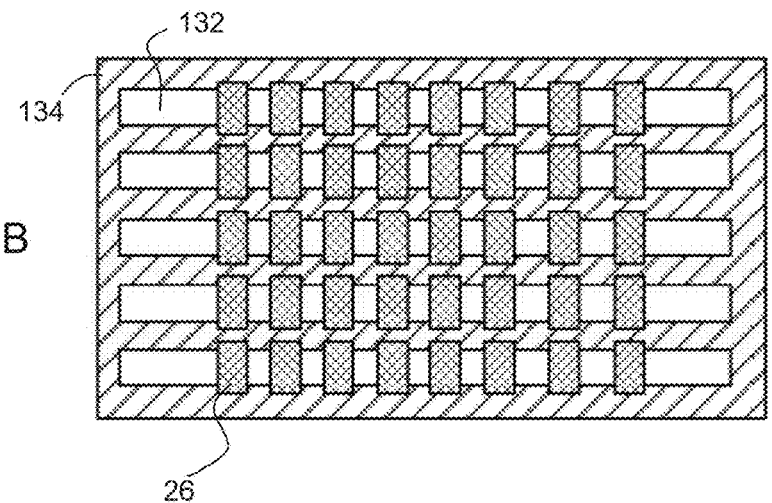
Figure 14C:
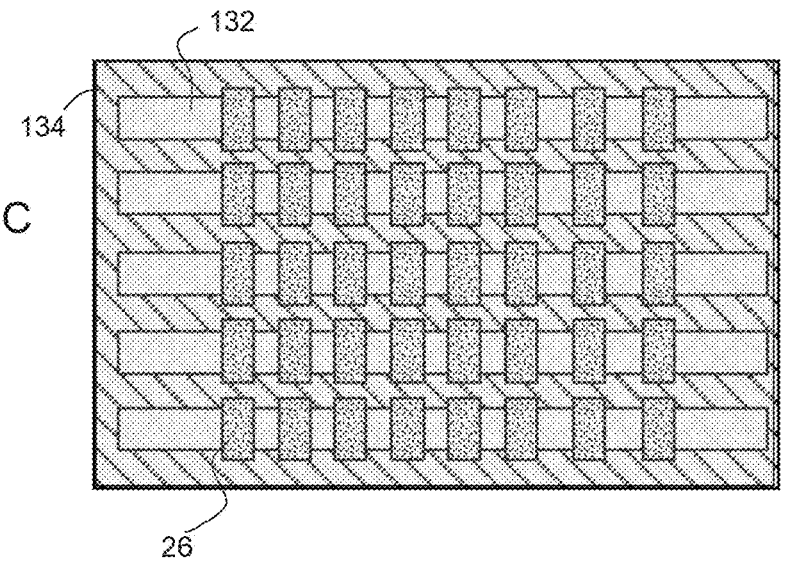

A suitable fabrication process for a NAND memory array according to some embodiments of the present invention is illustrated in FIGS. 14A-C.

FIG. 14A illustrates a patterned silicon, including active stripes 132 and isolation regions 134 (e.g., trench isolation regions). FIG. 14B illustrates deposited segments of tubular sacrificial scaffolds 22. The diameter of scaffold 22 is sufficient to perform a photolithography process (e.g., 100-200 nm). The space between the scaffolds can be about 50-150 nm.

FIG. 14C illustrates tubular nanoshells 26 after the execution of the operations described above (see, e.g., selected operations illustrated in FIGS. 4A-E), and subsequent covering of the array with a 200-300 nm layer of a semiconductor such as polysilicon. The layer can be patterned, e.g., by lithography, as known in the art. Thereafter, an etching operation is applied to form the word lines 136, to define select gates 140 and to uncover the bit lines 132. The etching operation is preferably executed so as to form openings 25 in the nanoshell structures 26.

Alternatively, the treatment for removing the sacrificial scaffolds can be executed following the patterning or flowing the etching operation.

Thereafter, a doping process, for example, $N^+$ ion implant (e.g., at a voltage of 1-5 keV), is executed through the resulting openings 25 to form the source/drain regions 138, this operation is represented by a block arrow in FIG. 13A. Alternatively, the doping to form source/drain regions 138 can be executed directly to active stripes 132 before the deposition of the sacrificial scaffold thereon. Following the ion implant process, a short oxidation procedure can optionally be employed to restore the oxide layer 36. Also contemplated are other known semiconductor processing operations, including, without limitation, LDD, spacer formation and the like. The result is illustrated in FIGS. 13A and 13B.

Figure 15:
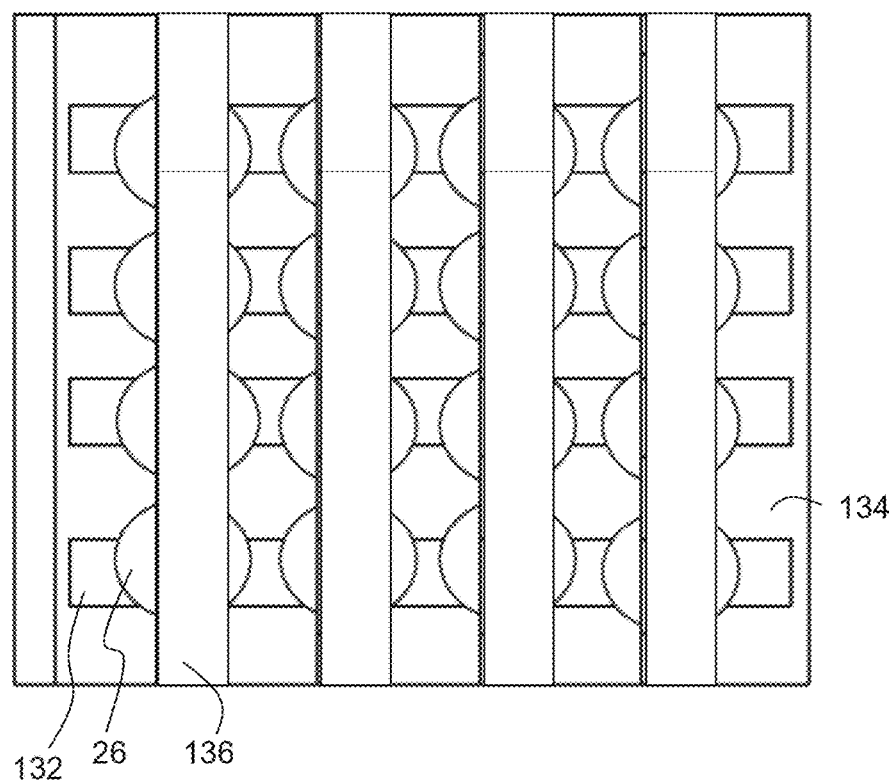
FIG. 15 is a schematic illustration of a NAND memory array based on generally spherical nanoshell structures, according to some embodiments of the present invention.

While the embodiments above are described with a particular emphasis to NAND array which comprises tubular nanoshells, it is to be understood that more detailed reference to tubular nanoshells is not to be interpreted as limiting the scope of the invention in any way. Thus, in some embodiments of the present invention NAND array 130 can comprise nanoshell structures having other shapes. FIG. 15 illustrates an embodiment of the invention in which a NAND array 130 is formed from nanoshells having spherical shape.

The NAND array of the present embodiments has many advantages over conventional systems. For example, the NAND memory can be formed in VLSI back end or in Polysilicon on cheap (e.g. organic) substrates. The NAND of the present embodiments has dense arrays. Typical density is $0.3 \ \mu m \times 0.8 \sim 0.25 \ \mu m^2$/cell. Another advantage is the use of a floating gate consisting of 2 parts, since such configuration increases reliability. An additional advantage is that the fabrication can include only one additional mask to the core CMOS (for embedded NVM).

The nanoshell structured of the present embodiments can also be employed in an energy storage device, such as, but not limited to, electrical cell, electrochemical cell, power source and supercapacitor. A substrate having the nanoshell structures of the present embodiments on its surface, can have high relative surface area, and optionally other properties selected from the group consisting of high density rate, high heat dissipation rate and/or high dispersion rate. Additionally, the nanoshell structures of the present embodiments facilitate quantum sizing effect, micro sizing effect, surface effect and/or macroscopic quantum tunneling. Such properties make the nanoshell structures useful in production of cells having high charging current that allows fast charging of the energy storage devices.

Two types of electrical energy storage devices are contemplated by the present embodiments. In some embodiments, the electrical energy storage device is embodied as a battery device whereby charge storage is achieved via electron transfer that produces a redox reaction. In some embodiments, the electrical energy storage device is embodied as an electric double-layer capacitor, also known as a supercapacitor, whereby the storage of electrical energy is electrostatic, substantially devoid of any electron transfer.

To avoid possible confusion between a single cell and electrical energy storage device which may have one or more cells, the terms "cell" and electrical energy storage device are used interchangeably, except where the context clearly indicates otherwise. As used herein the term "electrode" is used to mean a phase through which charge is carried by electronic movement. Electrodes can be metals or semiconductors, and they can be solid or liquid. Also as used herein, the term "electrolyte" is generally defined as a phase through which charge is carried by the movement of ions. Electrolytes may be any phase on the continuum of liquid to solid, including gels, pastes, fused salts, or ionically conducting solids, such as sodium β-alumina, which has mobile sodium ions.

Figure 20:
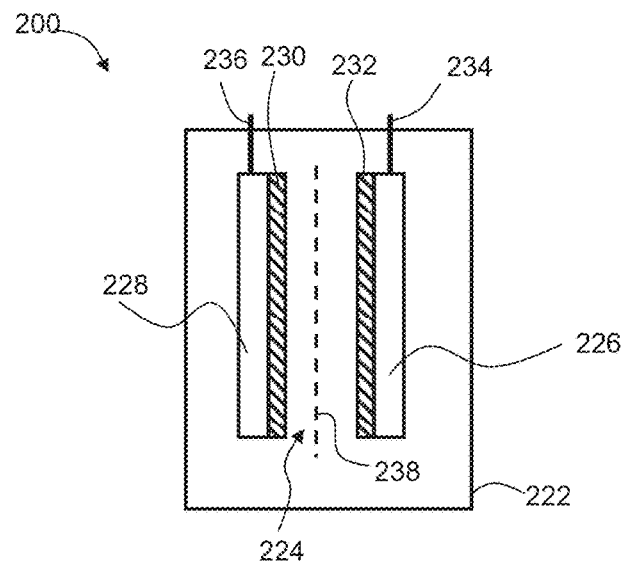
FIG. 20 is a schematic illustration of an energy storage device, according to some embodiments of the present invention.

FIG. 20 is a schematic illustration of an energy storage device 200 which comprises a body 222 optionally filled with electrolyte 224, and an anode 226 and a cathode 228 disposed within body 222. Body 222 can include one or more cell units, each being defined between one anode and one cathode, as known in the art. Device 200 can serve as a battery, in which case anode 226 and cathode 228 form a redox couple, or a supercapacitor, in which case electrical energy is stored electrostatically.

Anode 226 and/or cathode 228 are coated, at least partially, with a plurality of nanoshell structures (e.g., nanoshell structures 26) forming nanostructured layers 232 and 230, respectively. In various exemplary embodiments of the invention a separator 238 is introduced between anode 226 and cathode 228. Separator 238 can be made of a separating material used in typical supercapacitors or batteries. Optionally, electrically conducting contacts 234 and 236 are connected to anode 226 and cathode 228, respectively. The nanoshell structures in layers 232 and 230 are preferably selected in accordance with the function of the respective electrode. Due to the aforementioned properties of the nanoshell structures, anode 228 and/or cathode 228 can pass through very large recharging and discharging electrical current without causing joule heat, nor accompanying heat effects. Therefore, it greatly reduces recharging time.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Figure 16A:
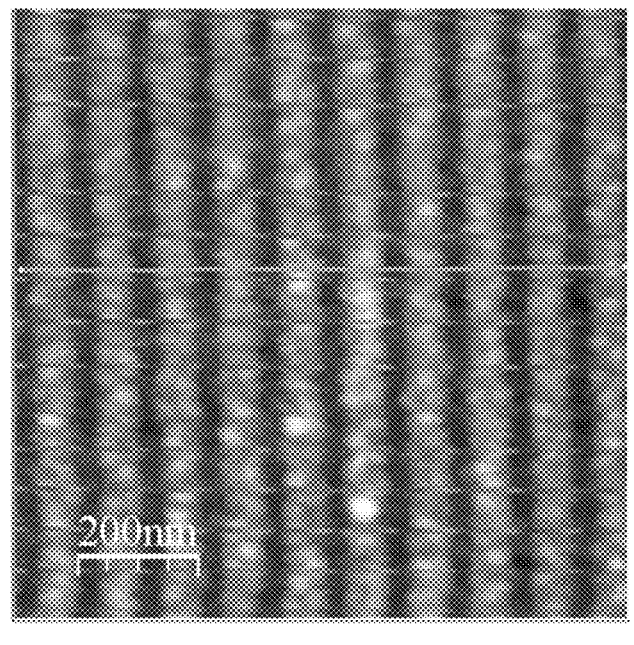
FIGS. 16A-B show experimental results obtained in accordance with some embodiments of the present invention.
Figure 16B:
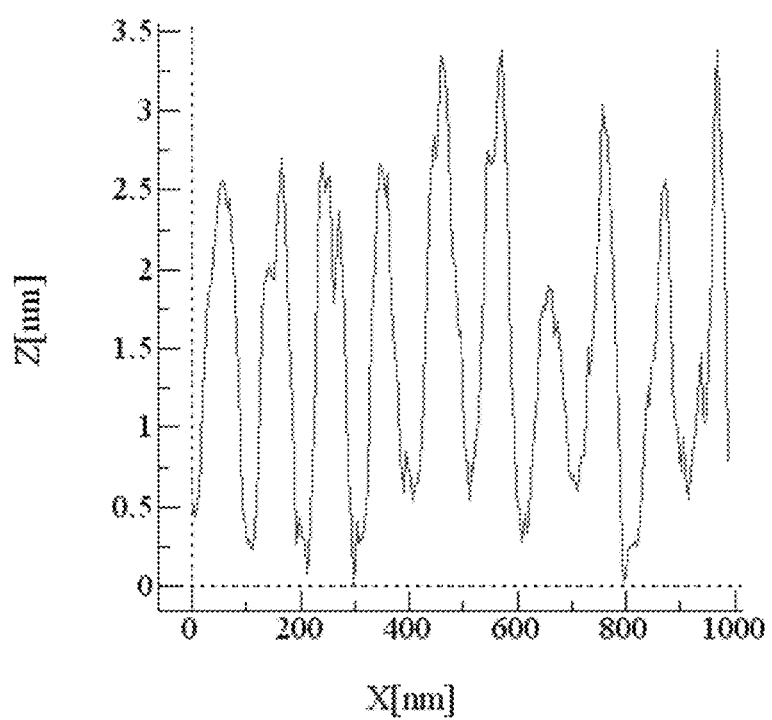

FIGS. 16A-B show experimental results obtained in accordance with some embodiments of the present invention. FIG. 16A is an electron microscopy image of peptide nanodots patterned on a substrate by focus ion beam patterning. FIG. 16B is a graph depicting the height of the nanodots above the surface as measured during a scan along the horizontal green line shown in FIG. 16A. As shown the size of the peptide nanodots is 2-3 nm.

Figure 17A:
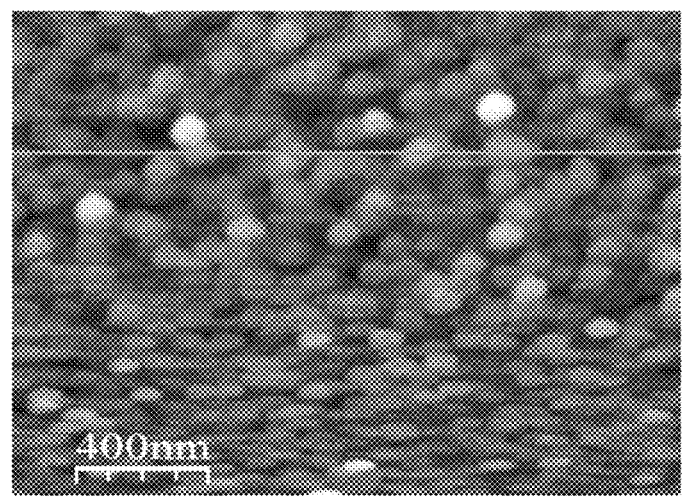
FIGS. 17A-B show additional experimental results obtained in accordance with some embodiments of the present invention.
Figure 17B:
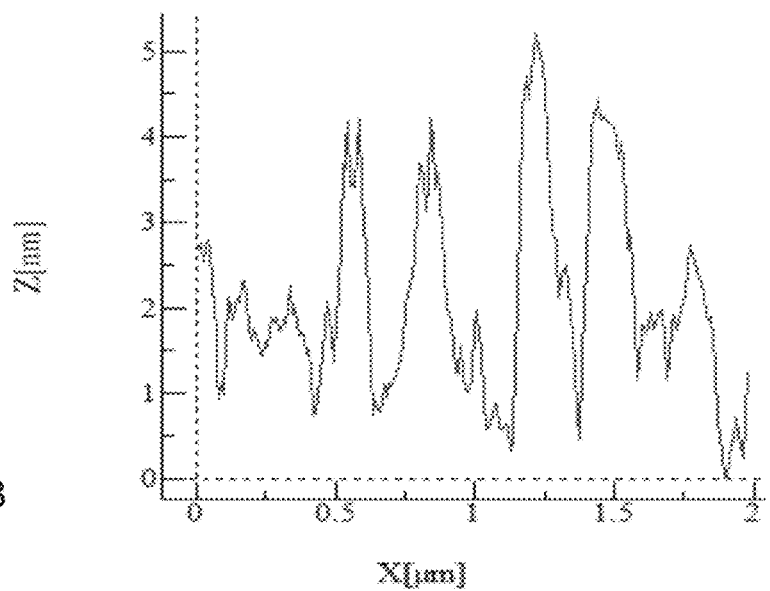

FIGS. 17A-B show experimental results obtained in accordance with some embodiments of the present invention. FIG. 17A is an atomic force microscopy image of peptide nanodots, and FIG. 17B is a graph depicting the height of the nanodots above the surface as measured during a scan along the horizontal green line shown in FIG. 17A. Subtracting the zero height readings, the size of the peptide nanodots is 2-3 nm.

Figure 18:
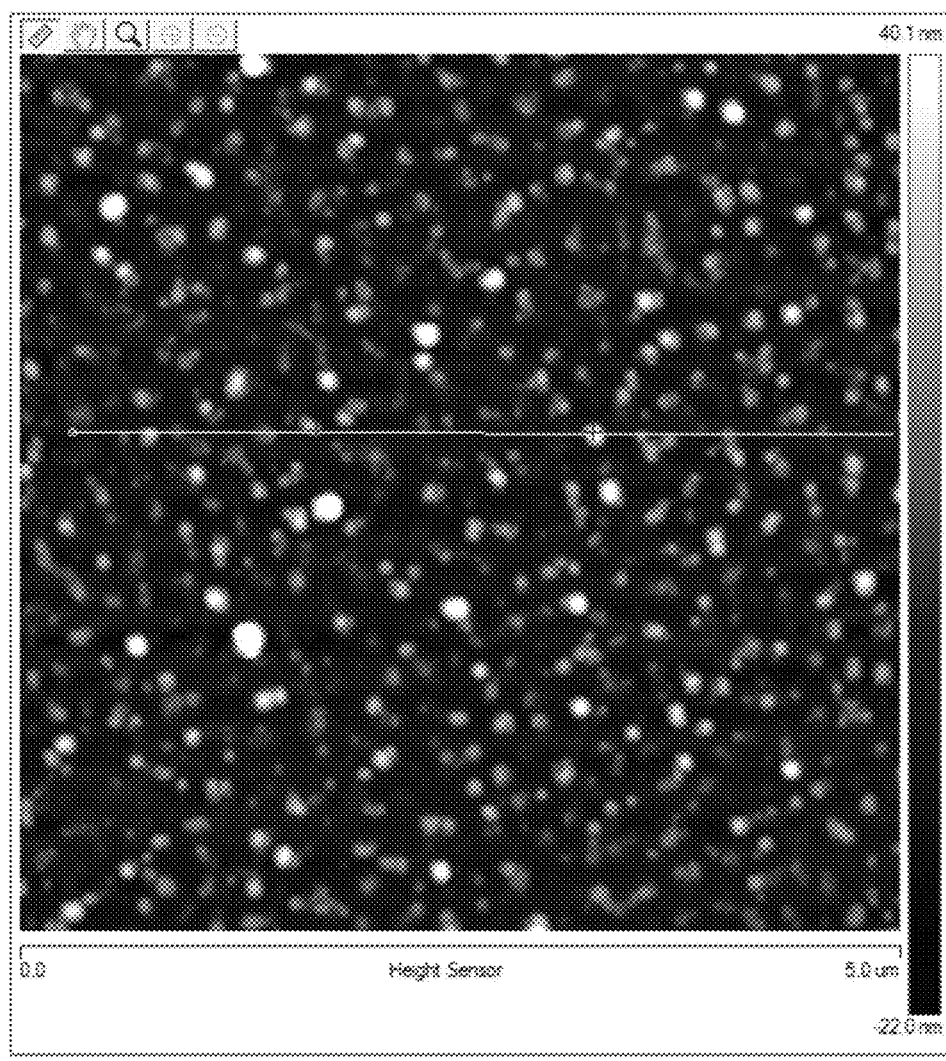
FIG. 18 shows additional experimental results obtained in accordance with some embodiments of the present invention.

FIG. 18 shows show experimental results obtained in accordance with some embodiments of the present invention. FIG. 18 is an atomic force microscopy image of peptide nanodots, deposited on a Silicon Oxide surface at a density of $10^{11}$ cm$^{-2}$.

Figure 19A:
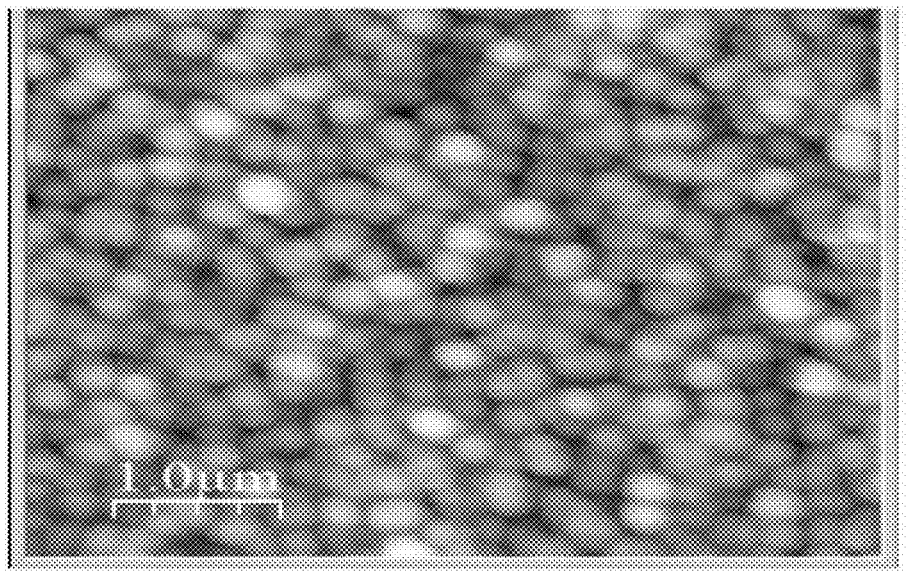
FIGS. 19A-C show additional experimental results obtained in accordance with some embodiments of the present invention.
Figure 19B:
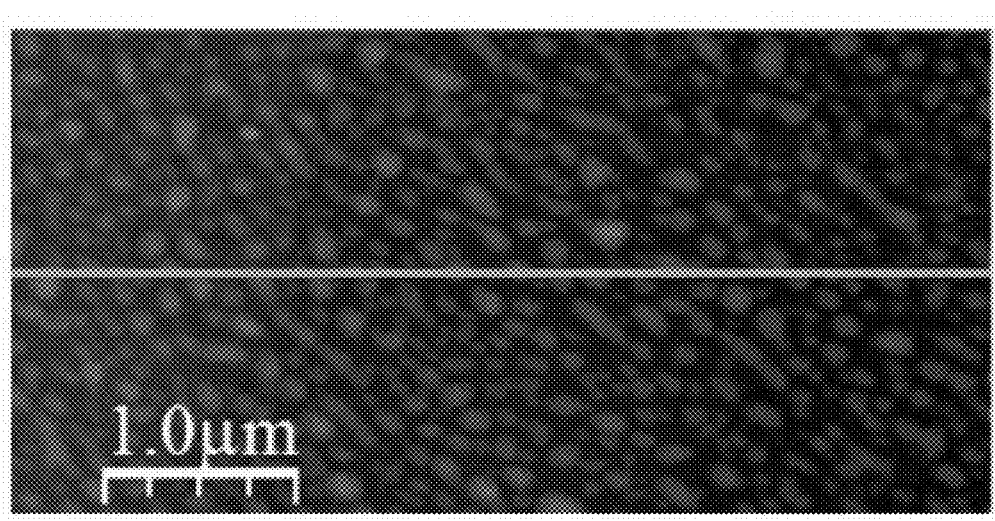
Figure 19C:
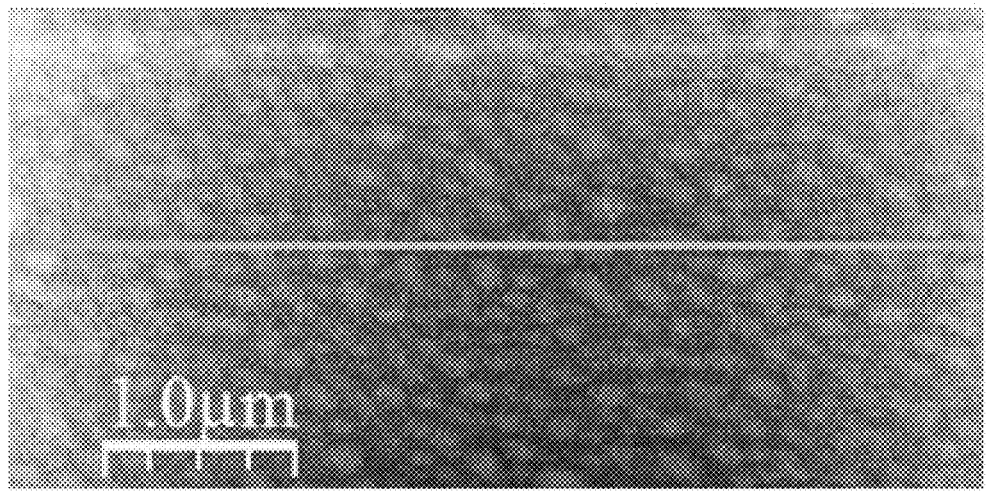

FIGS. 19A-C show experimental results obtained in accordance with some embodiments of the present invention. FIGS. 19A-C are atomic force microscopy (FIGS. 19A-B) and Kelvin probe microscopy (FIG. 19C) images of hollow nanodots obtained after coating peptide nanodots, about 2-3 nm in diameter, with a layer of $HfO_2$ using ALD, and removal of the peptide nanodots by heating thereafter. The thickness of the diameter of the obtained hollow nanoshells was about 8 nm.

REFERENCES

[1] Y. K. Lee et al. Surface Plasmon-Driven Hot Electron Flow Probed with Metal-Semiconductor Nanodiodes, Nano Letts., 11(10) pp. 4251-4255, 2011.
[2] S. T "Kochuveedu, et al. Surface-Plasmon-Induced Visible Light Photocatalytic Activity of TiO2 Nanospheres Decorated by Au Nanoparticles, Journal of Physical Chemistry C, v. 116 2500-2506, 2012.
[3] K. Nakayama, et. al. Plasman nanoparticles enhanced light absorption in GaAs solar cells, Appl. Phys. Lett, 93 121904 (2008).
[4] P. K. Jain, et al. Noble Metals on the Nanoscale: Optical and Photothermal Properties and Some Applications in Imaging, Sensing, Biology, and Medicine Accounts on Chemical research, Vol. 411578-1586, No. 12.
[5] M. B. Cortie et. al, Optical properties and plasmon resonances of titanium nitride Nanotechnologu v. 21, 115201, 2010.
[6] P. R. West, et al. Searching for better plasmonic materials. Laser & Photon. Review 1-13, 2010.
[9] Jain, P. K.; Universal Scaling of Plasmon Coupling in Metal Nanostructures: Extension from Particle Pairs to Nanoshells. Nano Lett. 2007, 7, 2854-2858.
[10] Joe; In-Sung et al., USA patent application 20090146198, Photodiodes, images sensing devices and image sensors, 2009.
[11] Cha, Dae-ki et al, U.S. Pat. No. 8,143,685, Image sensor having nanodot, 2012.
[12] Sargent, E. et al U.S. Pat. No. 8,054,671 Method of making quantum dot films, 2011.
[13] S. Pillai, et. al "Surface plasmon enhanced silicon solar cells," J. Appl. Phys. 101, 093105 (2007).
[14] L Adler-Abramovich et al, Angew. Chem. Int. Ed., 2010, DOI: 10.1002/anie.201002037)
[16] V. Mikhelashvili, et. al Appl. Phys. Lett., 98, 022905 (2011)
[17] U.S. Pat. No. 7,723,186 (Purayath, et al. 2010)
[18] Thomas W H Oates, et. al, Aligned Silver Nanoparticles on Rippled Silicon Templates Exhibiting Anisotropic Plasmon Absorption, Plasmonics (2007) Volume: 2, Issue: 2, Pages: 47-50.
[19] U.S. Pat. No. 7,928,503 (H. Hanafi, Memory cells), 2010
[20] T. H. Han. et al., Small-journal, Vol. 6, April 2010 pp. 945-951
[21] Wilson et al., Chem. MATER. 17, 5625, 2005
[22] Jeffrey W. Elam et al., ALD deposition of ITO thin films using nonhalogenated precursors, J. Phys. Chem. C 2008, 112, 1938-1945
[23] J. W. Elama Surface chemistry and film growth during TiN atomic layer deposition using TDMAT and NH3, Thin Solid Films 436 (2003) 145-156.
[24] A Niskanen et al., Radical-Enhanced Atomic Layer Deposition of Silver Thin Films Using Phosphine-Adducted Silver Carboxylates, Chemical Vapor Deposition (2007) Volume: 13, Issue: 8, Pages: 408-413.
[25] Z. Li, et al, Atomic layer deposition of ultrathin copper metal films, J. Electrochem. Soc., 153 (11) c787-C-794 (2006).
[26] H. Wang, Tunable plasmonic nanostructures, Thisis, Rice University, 2008.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of fabricating a nanoshell, comprising coating a nanometric core made of a first material by a second material, to form a core-shell nanostructure and applying non-chemical treatment to said core-shell nanostructure so as to at least partially remove said nanometric core, thereby fabricating a nanoshell, wherein said first material is a synthesized biological material and said second material comprises metal.

2. The method according to claim 1, wherein said second material comprises a ferromagnetic material.

3. The method according to claim 1, wherein said coating is by atomic layer deposition.

4. The method according to claim 1, wherein said nanometric core has a shape selected from the group consisting of a generally spherical shape, a tubular shape and a planar shape.

5. The method according to claim 1, wherein said nanometric core has an irregular shape.

6. The method according to claim 1, further comprising depositing at least one additional layer on said nanometric core or said core-shell nanostructure.

7. The method according to claim 1, wherein said nanometric core is one of a multiplicity of nanometric cores made of said first material, wherein said coating comprises coating said multiplicity of nanometric cores by second material to form a respective multiplicity of core-shell nanostructures, and wherein said non-chemical treatment is selected to at least partially remove said multiplicity of nanometric cores, thereby fabricating a multiplicity of nanoshell structures, said multiplicity of nanoshell structures being arranged to form an image sensor having an array of picture-elements, each picture-element having nanoshell structures.

8. The method according to claim 1, wherein said nanometric core is one of a multiplicity of nanometric cores made of said first material, wherein said coating comprises coating said multiplicity of nanometric cores by second material to form a respective multiplicity of core-shell nanostructures, and wherein said non-chemical treatment is selected to at least partially remove said multiplicity of nanometric cores, thereby fabricating a multiplicity of nanoshell structures, said multiplicity of nanoshell structures being arranged over a pixel area of an image sensor, said pixel area comprising a plurality of sub-pixel areas, wherein each sub-pixel area comprises a plurality of nanoshell structures, and wherein, for each sub-pixel area, shell thicknesses of nanoshell structures in said sub-pixel area differ from shell thicknesses of nanoshell structures in all other sub-pixel areas.

9. The method according to claim 8, wherein said fabricating said multiplicity of nanoshell structures to form said pixel area comprises:
depositing said multiplicity of nanometric cores made of said first material on a substrate;
coating said multiplicity of nanometric cores by said second material;
applying said non-chemical treatment to at least partially remove said nanometric core, thereby to form said multiplicity of nanometric shell structures;
applying a mask on nanometric shell structures occupying a first sub-pixel area;
coating said mask and nanometric shell structures occupying other sub-pixel areas by said second material; and
removing said mask.

10. A method of fabricating an imager, comprising:
depositing a multiplicity of nanometric structures made of a first material over a pixel array, wherein each pixel is defined over a plurality of sub-pixel areas, and wherein each sub-pixel area is occupied by a plurality of nanometric structures;
coating said multiplicity of nanometric structures by a second material;
applying a mask on nanometric shell structures occupying at least a first sub-pixel area, leaving nanometric shell structures occupying at least a second sub-pixel area unmasked;
coating said mask and said unmasked nanometric shell structures; and
removing said mask.

11. The method of claim 10, comprising applying a non-chemical treatment to at least partially remove cores of said nanometric structures, thereby forming a multiplicity of nanometric shell structures.

* * * * *